(12) United States Patent
Sharma

(10) Patent No.: US 12,471,289 B2
(45) Date of Patent: *Nov. 11, 2025

(54) DIAGONAL MEMORY WITH VERTICAL TRANSISTORS AND WRAP-AROUND CONTROL LINES

(71) Applicant: Intel Corporation, Santa Clara, CA (US)

(72) Inventor: Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 736 days.

This patent is subject to a terminal disclaimer.

(21) Appl. No.: 17/558,688

(22) Filed: Dec. 22, 2021

(65) Prior Publication Data

US 2023/0200084 A1   Jun. 22, 2023

(51) Int. Cl.
  *H10B 53/30* (2023.01)
  *H10B 53/10* (2023.01)

(52) U.S. Cl.
  CPC ............ *H10B 53/30* (2023.02); *H10B 53/10* (2023.02)

(58) Field of Classification Search
  CPC ......... H10B 53/30; H10B 53/10; H10B 12/05
  See application file for complete search history.

(56) References Cited

U.S. PATENT DOCUMENTS

| | | |
|---|---|---|
| 5,192,704 A | 3/1993 | McDavid et al. |
| 5,218,568 A | 6/1993 | Lin et al. |
| 5,412,596 A | 5/1995 | Hoshiba |
| 5,515,311 A | 5/1996 | Mihara |

(Continued)

FOREIGN PATENT DOCUMENTS

| | | |
|---|---|---|
| CN | 108110007 A | 6/2018 |
| CN | 109148454 A | 1/2019 |

(Continued)

OTHER PUBLICATIONS

Chang et al., "A Thermodynamic Perspective of Negative-Capacitance Field-Effect Transistors" IEEE Journal on Exploratory Solid-State Computational Devices and Circuits; vol. 3; 9 pages (2017).

(Continued)

*Primary Examiner* — Allison Bernstein
(74) *Attorney, Agent, or Firm* — Akona IP PC

(57) ABSTRACT

An example IC device includes a plurality of vertical transistors which may be part of memory cells, thus realizing vertical-transistor based memory. The IC device further includes a wordline, electrically continuous along a first longitudinal axis and electrically coupled to gates of a first subset of the transistors, and a control line that may be either a bitline or a plateline, electrically continuous along a second longitudinal axis and wrapping around at least portions of channel materials of a second subset of the transistors, where the first subset and the second subset have one transistor in common. At least one of the first longitudinal axis and the second longitudinal axis is not parallel to any edges or borders of the support structure, and, as a result, such a memory is referred to as "diagonal memory." The transistors may be hysteretic transistors and/or may be further coupled to hysteretic capacitors.

28 Claims, 20 Drawing Sheets

(56) References Cited

U.S. PATENT DOCUMENTS

| | | | |
|---|---|---|---|
| 5,523,964 | A | 6/1996 | McMillan et al. |
| 5,600,587 | A | 2/1997 | Koike |
| 6,121,660 | A | 9/2000 | Yamazaki et al. |
| 6,140,672 | A | 10/2000 | Arita et al. |
| 6,438,021 | B2 | 8/2002 | Kato |
| 6,455,883 | B2 | 9/2002 | Kato et al. |
| 6,642,563 | B2 | 11/2003 | Kanaya |
| 6,809,951 | B2 | 10/2004 | Yamaguchi |
| 6,888,160 | B1 | 5/2005 | Nakajima et al. |
| 7,187,575 | B2 | 3/2007 | Kijima et al. |
| 7,514,734 | B2 | 4/2009 | Aggarwal et al. |
| 7,812,384 | B2 | 10/2010 | Ozaki |
| 9,679,893 | B2 | 6/2017 | Yan et al. |
| 9,698,272 | B1 | 7/2017 | Ikeda et al. |
| 9,842,839 | B1 | 12/2017 | Sills et al. |
| 10,128,327 | B2 | 11/2018 | Zhang |
| 10,403,631 | B1 | 9/2019 | Lu et al. |
| 11,114,471 | B2 * | 9/2021 | Doyle ............... H01L 21/76802 |
| 12,148,734 | B2 | 11/2024 | Atanasov et al. |
| 2002/0006052 | A1 | 1/2002 | Kato et al. |
| 2002/0043676 | A1 | 4/2002 | Ohtsuka et al. |
| 2003/0235067 | A1 | 12/2003 | Sakai et al. |
| 2005/0094457 | A1 | 5/2005 | Chen et al. |
| 2005/0199878 | A1 | 9/2005 | Arao et al. |
| 2005/0199913 | A1 | 9/2005 | Hofmann et al. |
| 2006/0268597 | A1 | 11/2006 | Sakuma |
| 2006/0284224 | A1 | 12/2006 | Shuto |
| 2008/0048226 | A1 | 2/2008 | Heo et al. |
| 2008/0121956 | A1 | 5/2008 | Kanaya |
| 2008/0142915 | A1 | 6/2008 | Sashida |
| 2008/0303119 | A1 | 12/2008 | Watanabe |
| 2009/0278120 | A1 | 11/2009 | Lee et al. |
| 2010/0039850 | A1 | 2/2010 | Kitazaki |
| 2010/0052029 | A1 | 3/2010 | Huang |
| 2010/0321975 | A1 | 12/2010 | Kimura et al. |
| 2011/0084314 | A1 | 4/2011 | Or-Bach et al. |
| 2012/0040528 | A1 | 2/2012 | Kim et al. |
| 2012/0314476 | A1 | 12/2012 | Appenzeller et al. |
| 2013/0075717 | A1 | 3/2013 | Tsang |
| 2013/0175665 | A1 | 7/2013 | Chudzik et al. |
| 2013/0200361 | A1 | 8/2013 | Tsang |
| 2014/0342529 | A1 | 11/2014 | Goktepeli et al. |
| 2015/0060957 | A1 | 3/2015 | Lee et al. |
| 2015/0171225 | A1 | 6/2015 | Shi et al. |
| 2015/0228659 | A1 | 8/2015 | Vu et al. |
| 2015/0279842 | A1 | 10/2015 | Komeda |
| 2016/0027490 | A1 | 1/2016 | Müller |
| 2017/0103988 | A1 | 4/2017 | Nishida et al. |
| 2018/0061840 | A1 | 3/2018 | Sills |
| 2018/0102374 | A1 | 4/2018 | Chavan et al. |
| 2018/0182763 | A1 | 6/2018 | Juengling |
| 2018/0331029 | A1 | 11/2018 | Sukekawa |
| 2019/0139960 | A1 | 5/2019 | Sills et al. |
| 2019/0189357 | A1 | 6/2019 | Chavan et al. |
| 2019/0326296 | A1 | 10/2019 | Wang et al. |
| 2019/0348540 | A1 | 11/2019 | Pillarisetty et al. |
| 2019/0371802 | A1 | 12/2019 | Morris et al. |
| 2020/0075609 | A1 | 3/2020 | Morris et al. |
| 2020/0091162 | A1 | 3/2020 | Morris et al. |
| 2020/0098926 | A1 | 3/2020 | Sharma et al. |
| 2020/0126987 | A1 | 4/2020 | Rubin et al. |
| 2020/0185385 | A1 | 6/2020 | Juengling |
| 2020/0194443 | A1 | 6/2020 | Lin et al. |
| 2020/0212075 | A1 | 7/2020 | Doyle et al. |
| 2020/0273867 | A1 | 8/2020 | Manipatruni et al. |
| 2020/0286984 | A1 | 9/2020 | Chang et al. |
| 2021/0066306 | A1 | 3/2021 | Tang et al. |
| 2021/0202485 | A1 | 7/2021 | Inaba |
| 2021/0296556 | A1 | 9/2021 | Hsu et al. |
| 2021/0398991 | A1 | 12/2021 | Manfrini et al. |
| 2022/0115376 | A1 | 4/2022 | Kim et al. |
| 2022/0189913 | A1 | 6/2022 | Atanasov et al. |
| 2022/0189957 | A1 | 6/2022 | Atanasov et al. |
| 2022/0285350 | A1 | 9/2022 | Okajima et al. |
| 2022/0302311 | A1 | 9/2022 | Tajima |
| 2022/0352256 | A1 | 11/2022 | Su et al. |
| 2023/0008261 | A1 * | 1/2023 | Sharma ............... H10D 30/701 |
| 2023/0200075 | A1 * | 6/2023 | Gomes ............... G11C 11/223 |
| | | | 257/213 |
| 2023/0200084 | A1 | 6/2023 | Sharma |
| 2023/0363174 | A1 | 11/2023 | Yamazaki et al. |

FOREIGN PATENT DOCUMENTS

| | | |
|---|---|---|
| CN | 109542839 A | 3/2019 |
| CN | 104425576 B | 4/2019 |
| CN | 208923136 U | 5/2019 |
| EP | 1265254 A3 | 7/2004 |
| EP | 4012767 | 6/2022 |
| JP | 2008153479 A | 7/2008 |
| JP | 4523115 B2 | 8/2010 |
| JP | 3169406 U | 7/2011 |
| WO | 2010131310 A1 | 11/2010 |
| WO | 2017171739 A1 | 10/2017 |
| WO | 2018111215 A1 | 6/2018 |
| WO | 2018125024 A1 | 7/2018 |
| WO | 2018231210 A1 | 12/2018 |

OTHER PUBLICATIONS

Chang et al., "Inversion Charge Boost and Transient Steep-Slope Induced by Free-Charge-Polarization Mismatch in a Ferroelectric-Metal-Oxide-Semiconductor Capacitor," IEEE Journal on Exploratory Solid-State Computational Devices and Circuits; vol. 4, No. 2; 6 pages (Dec. 2018).

Chang et al., "Physical Origin of Transient Negative Capacitance in a Ferroelectric Capacitor," Physical Review Applied 9; 8 pages (2018).

Muller, J., et al "Ferroelectricity in YTTRIUM-Doped Hafnium Oxidde," Journal of Applied Physics; vol. 110, No. 11; Dec. 1, 2011 (5 pages).

Sallese, et al., "Principles of the 1-T DRAM Concept on SOI," LEG Laboratory, Swiss Federal Institute of Technology, EPFL, 1015 Lausanne, Switzerland; 19 pages.

European Extended Search Report issued in EP Application No. 21 19 5422.7 on Mar. 4, 2022; 8 pages.

European Extended Search Report issued in EP Application No. 21198370 on Mar. 24, 2022; 8 pages.

European Extended Search Report issued in European Application No. 19182447.3 on Feb. 12, 2020; 11 pages.

European Partial Search Report issued in European Application No. 19182447.3 on Nov. 6, 2019, 13 pages.

International Search Report and Written Opinion for PCT Application No. PCT/US2016/024828 mailed Dec. 26, 2016, 11 pages.

PCT Application No. PCT/US2017/056296, filed Oct. 12, 2017, "Recessed Thin-Channel Thin-Film Transistor," 46 pages.

PCT Application No. PCT/US2018/023757, filed Mar. 22, 2018, "Thin Film Transistors Having Double Gates," 40 pages.

European Extended Search Report issued Jun. 23, 2020 in EP Application No. 19 183 484.5; 10 pages.

International Search Report and Written Opinion for PCT Application No. PCT/US2016/066056 mailed Jul. 28, 2017, 10 pages.

International Search Report and Written Opinion for PCT Application No. PCT/US2016/068615 mailed Aug. 28, 2017, 12 pages.

Sharma, A., et al, "High Speed Memory Operation in Channel-Last, Back-gated Ferroelectric Transistors," 2020 IEEE International Electron Devices Meeting (IEDM), Dec. 12-18, 2020; downloaded IEEE Xplore Jun. 29, 2021; pp. 18.5.1-18.5-.4.

* cited by examiner

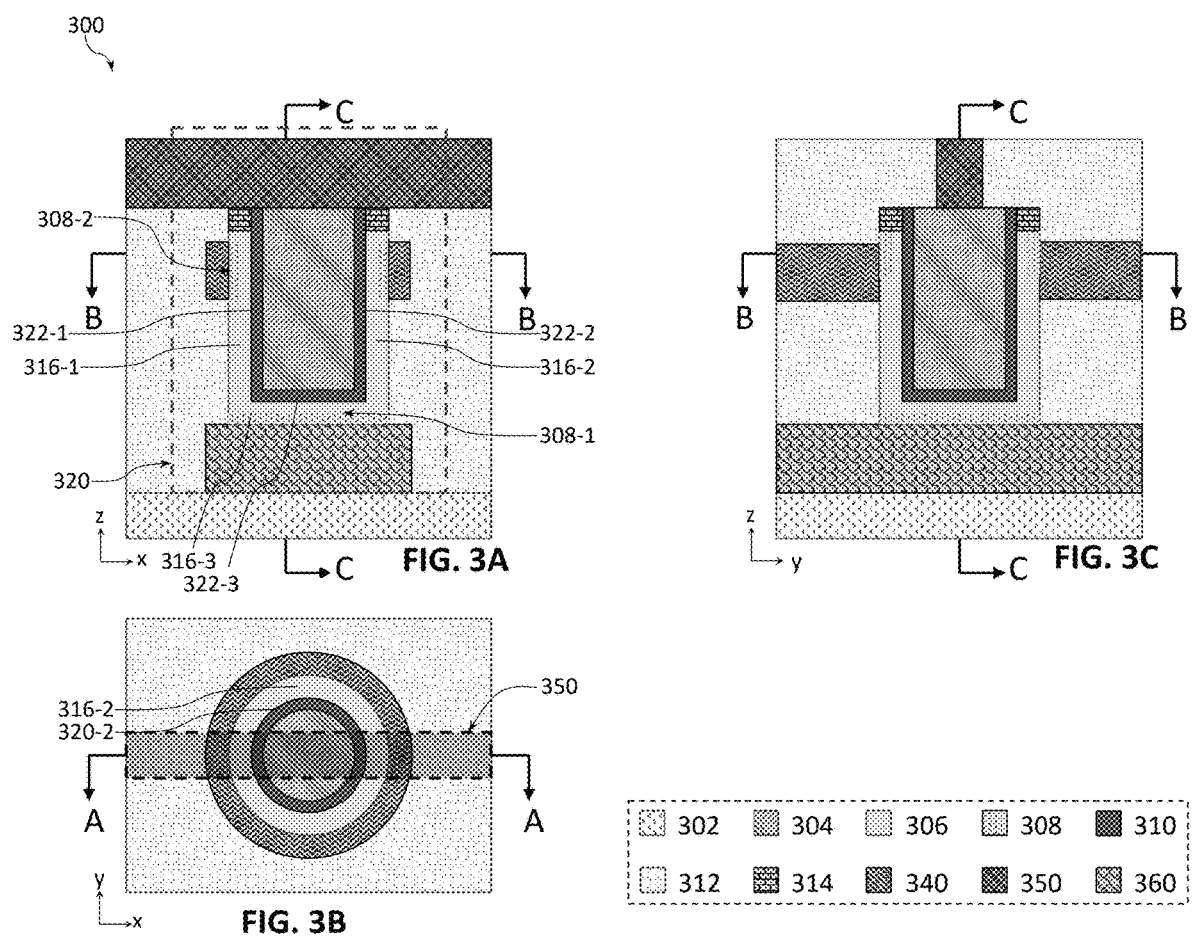

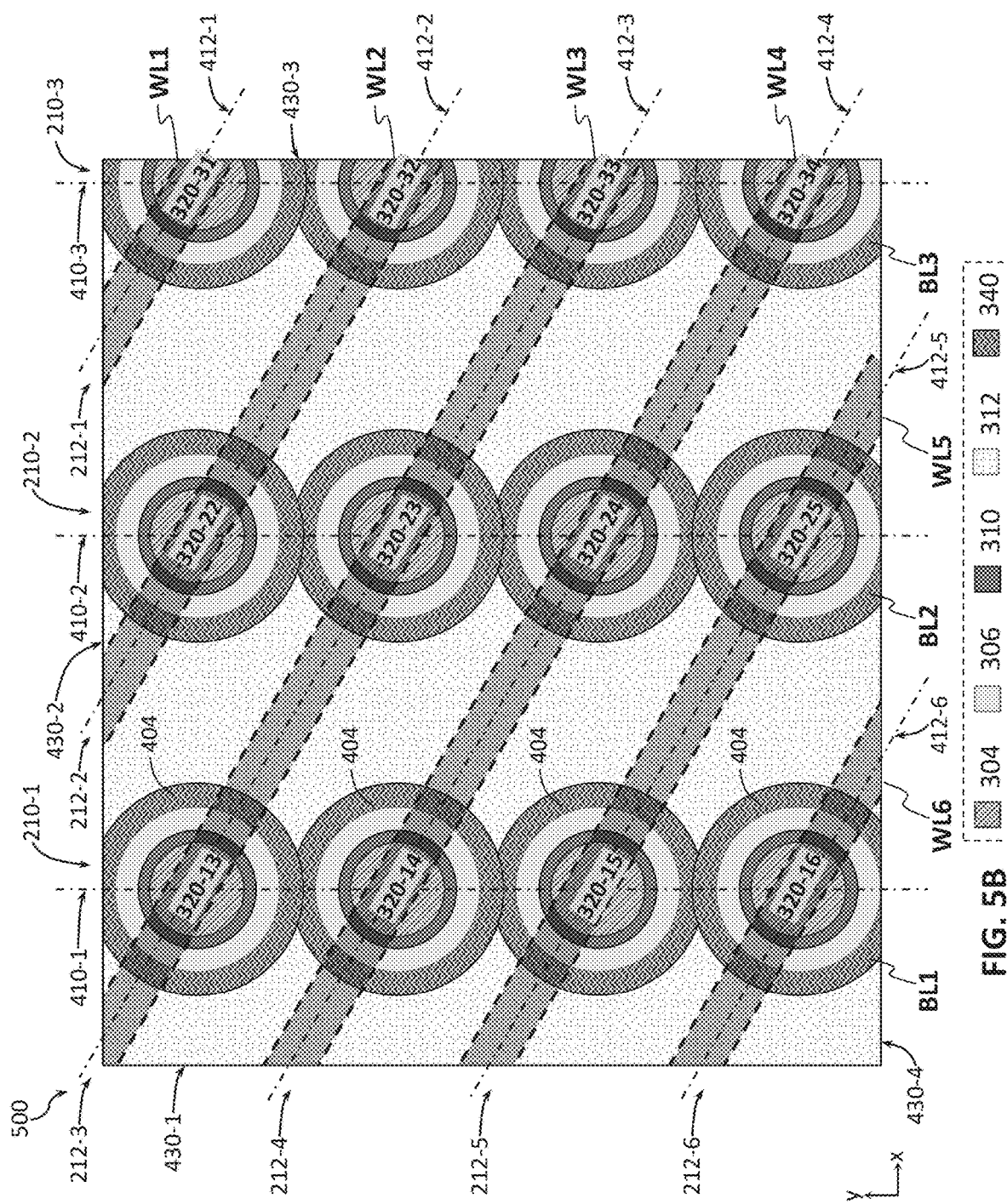

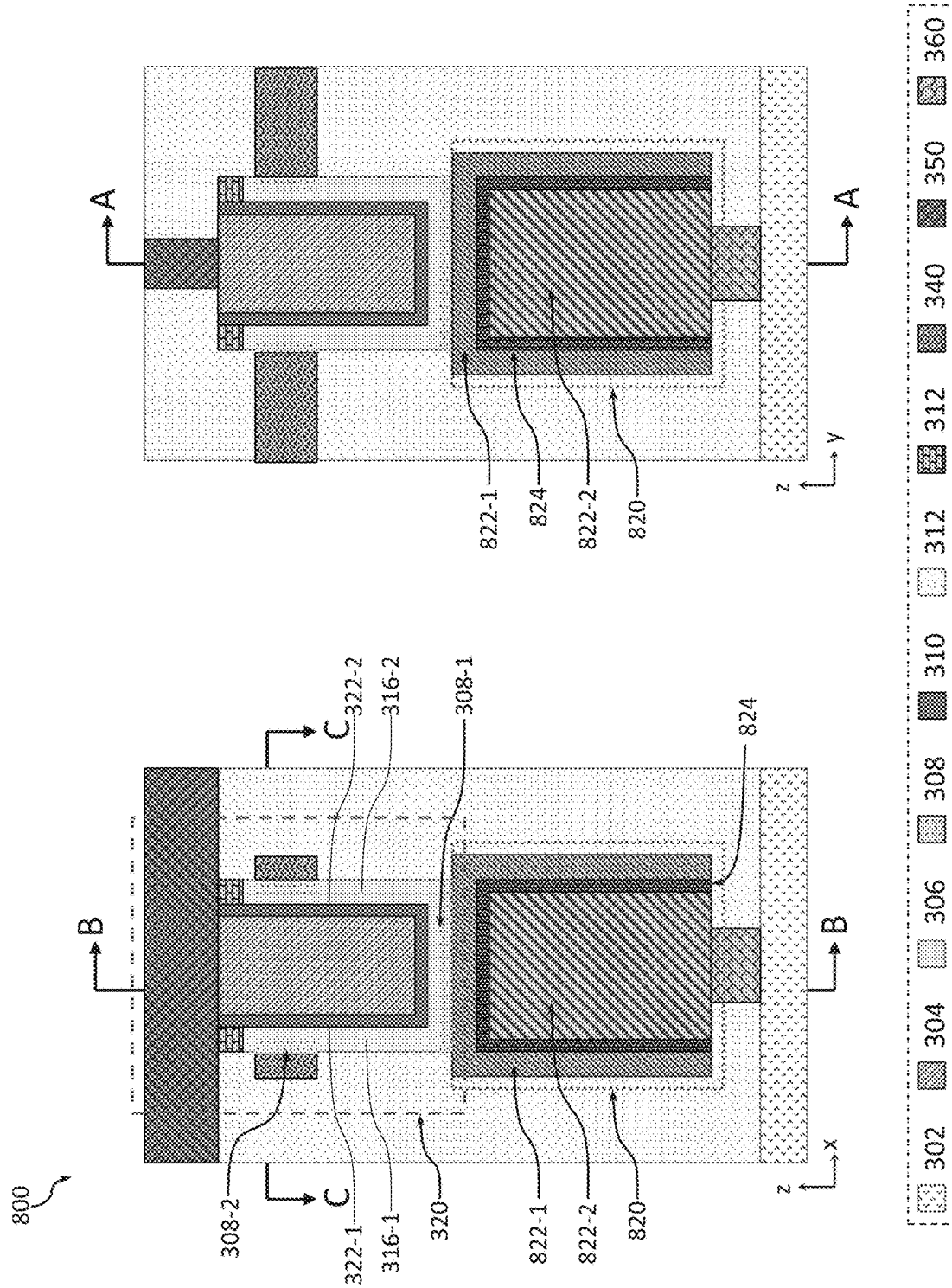

DIAGONAL MEMORY WITH VERTICAL TRANSISTORS AND WRAP-AROUND CONTROL LINES

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3C provide various views of an example integrated circuit (IC) device that may be used to implement a hysteretic memory cell of FIG. 1A with a vertical transistor and a wrap-around bitline, according to some embodiments of the present disclosure.

FIGS. 5A-5C provide various views of an example IC device implementing an array of a plurality of memory cells with the vertical transistors and wrap-around bitlines implemented as shown in FIG. 3, where bitlines are parallel to the edges of a support structure on which they are provided but wordlines are not physically orthogonal to the bitlines, according to some embodiments of the present disclosure.

FIGS. 8A-8B provide various views of an example IC device implementing a memory cell with a vertical transistor, a wrap-around bitline, and a capacitor, according to some embodiments of the present disclosure.

DETAILED DESCRIPTION

Figure 1B:
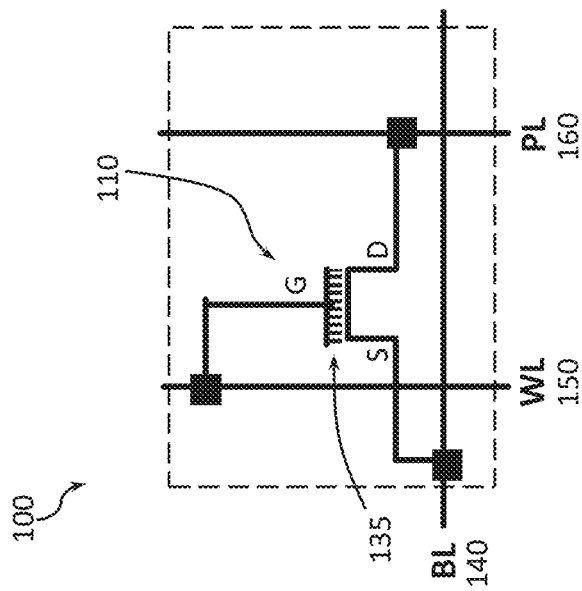
FIGS. 1A-1B are electric circuit diagrams of a hysteretic memory cell that may be implemented using a vertical transistor and a wrap-around bitline, according to some embodiments of the present disclosure.

Described herein are memory arrangements and corresponding methods and devices. The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices implementing diagonal memory with vertical transistors and wrap-around control lines as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to IC components, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Memory with diagonal memory with vertical transistors and wrap-around control lines as described herein may be particularly advantageous for, although not limited to, implementing hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are one example of hysteretic materials.

Layers of different materials arranged in a stack to exhibit charge-trapping phenomena is one example of a hysteretic arrangement.

A FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (i.e., in terms of polarization of) FE or AFE materials is referred to as "FE memory," where the term "ferroelectric" is said to be adopted to convey the similarity of FE memories to ferromagnetic memories, despite the fact that there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (i.e., a layer of a material configured to trap charges when a voltage is applied across the material) and the other one of which is a tunnelling layer (i.e., a layer of a material through which the charge is to be tunneled to the charge-trapping layer). The tunnelling layer may include an insulator material such as a material that includes silicon and oxygen (e.g., silicon oxide), or any other suitable insulator. The charge-trapping layer may include a metal or a semiconductor material that is configured to trap charges. For example, a material that includes silicon and nitrogen (e.g., silicon nitride) may be used in/as a charge-trapping layer. Because the trapped charges may be kept in a charge-trapping arrangement for some time even in the absence of an electric field, such arrangements may be used to implement memory cells. Because the presence and/or the amount of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

In general, READ and WRITE access to a hysteretic memory cell (i.e., performance of READ and WRITE operations) is realized using a combination of a wordline, a bitline, and a plateline, each of which is an electrically conductive line to which a certain voltage is applied to sense (i.e., READ) or program (i.e., WRITE) a memory state of a hysteretic memory cells. Together, such electrically conductive lines are referred to herein as "control lines" because they are used to control a memory state of a hysteretic memory cell.

Hysteretic memories have the potential for adequate non-volatility, short programming time, low power consumption, high endurance, and high speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

The performance of a hysteretic memory cell may depend on the number of factors. One factor is the ability of a cell to prevent or minimize detrimental effects of voltages which may unintentionally disturb a polarization state or a trapped charge that the cell is supposed to hold. Unlike ferromagnetic cores which have square-like hysteresis loops with sharp transitions around their coercive points, as is desirable for memory implementations, hysteresis loops of hysteretic materials/arrangements may not always have sharp transitions which means that even relatively small voltages can inadvertently disturb their polarization states. One approach to address this issue could be to improve processing techniques for creating hysteretic materials/arrangements in an attempt to realize square-like hysteresis loops. Another approach is to overcome this shortcoming of the materials by employing creative circuit architectures.

Commercial viability of hysteretic memories depends on a number of factors. One factor is the ability to improve hysteretic properties of hysteretic memory cells without increasing the cell size. Decreasing the critical voltage (Vc) that needs to be applied for switching of a hysteretic memory cell is one example of a desired improvement in hysteretic properties that could help commercial viability of hysteretic memories. One approach to decreasing Vc includes engineering superior hysteretic materials. However, such an approach is extremely difficult. Another approach includes decreasing the thickness of a gate dielectric material in a hysteretic memory cell. However, decreasing the dielectric thickness may also cause the threshold voltage change between written and erase states to decrease, making it more problematic to get hysteretic memory arrays to function because device variations make the switching window very tight. Other approaches involve complex fabrication sequences, increasing fabrication costs and hindering large-scale adoption of the technology.

Access transistors have been used in the past to realize memory where each memory cell includes one hysteretic capacitor for storing a memory state (e.g., logical "1" or "0") of the cell and an access transistor controlling access to the cell (e.g., access to write information to the cell or access to read information from the cell). Such a memory cell may be referred to as a "1T-1C memory cell," highlighting the fact that it uses one access transistor (i.e., "1T" in the term "1T-1C memory cell") and one capacitor (i.e., "1C" in the term "1T-1C memory cell"). The capacitor of a 1T-1C memory cell may be coupled to either a source or a drain (S/D) terminal/region of the access transistor (e.g., to the source terminal/region of the access transistor), while the other S/D terminal/region of the access transistor (e.g., to the drain terminal/region) may be coupled to a bitline, and a gate terminal of the access transistor may be coupled to a wordline. Since such a memory cell can be fabricated with as little as a single access transistor, it can provide higher density and lower standby power versus some other types of memory in the same process technology. The capacitors of 1T-1C memory cells may be implemented using a hysteretic material instead of, or in addition to, a conventional dielectric material, thus realizing hysteretic 1T-1C memory cells. Inventors of the present disclosure realized that conventional memory arrays implementing hysteretic 1T-1C memory cells may have limitations in terms of, e.g., the memory density, and fabrication approaches.

Embodiments of the present disclosure may improve on at least some of the challenges and issues of existing memory arrays by increasing memory density using fewer masks and at a lower cost. In particular, embodiments of the present disclosure provide various arrangements for IC devices implementing diagonal memory with vertical transistors and wrap-around control lines are disclosed. A vertical transistor is a type of a field-effect transistor (FET) where the source and the drain terminals of the transistor are vertically stacked with respect to a support structure (e.g., a substrate, a die, a wafer, or a chip) on which the transistor is implemented.

In one aspect of the present disclosure, an example IC device includes a memory cell that includes a vertical transistor that includes an opening in an insulator material provided over a support structure, where the sidewalls and the bottom of the opening are lined with a channel material and a gate insulator material so that the channel material is between the insulator material and the gate insulator material, and where the lined opening is at least partially filled with a gate electrode material so that the gate insulator material is between the channel material and the gate electrode material. The IC device further includes a first control line for the memory cell, e.g., a wordline, electrically coupled to (e.g., in conductive contact with) the gate electrode material, and a second control line for the memory cell, which may be either a bitline or a plateline, wrapping around at least portion of the sidewall of the opening to electrically couple to (e.g., be in conductive contact with) the channel material at the sidewall of the opening. In some embodiments, the vertical transistor may be a hysteretic transistor. In other embodiments, the vertical transistor may be further coupled to a hysteretic capacitor. As used herein, a transistor is referred to as a "hysteretic transistor" if, instead of or in addition to a conventional gate dielectric material, the transistor includes a hysteretic material or a hysteretic arrangement as a gate insulator. On the other hand, a capacitor is referred to as a "hysteretic capacitor" if, instead of or in addition to a conventional dielectric material, the capacitor includes a hysteretic material or a hysteretic arrangement as a capacitor insulator that separates first and second capacitor electrodes. An individual one of the multiple hysteretic transistors or hysteretic capacitors may store a memory state, thus realizing a memory cell of a memory array.

In another aspect of the present disclosure, an example IC device includes a plurality of vertical transistors provided over the support structure. The vertical transistors may be part of memory cells, thus realizing vertical-transistor based memory. The IC device further includes a wordline, electrically continuous along a first longitudinal axis and electrically coupled to (e.g., in conductive contact with) gates of a first subset of the plurality of vertical transistors, and a control line that may be either a bitline or a plateline, electrically continuous along a second longitudinal axis and wrapping around at least portions of channel materials of a second subset of the plurality of vertical transistors, where the first subset and the second subset have one vertical transistor in common. At least one of the first longitudinal axis and the second longitudinal axis is not parallel to any edges or borders of a rectangular support structure, and, as a result, such a memory is referred to as "diagonal memory." For example, the longitudinal axis of a bitline/plateline may be parallel to some edges of the support structure, but the longitudinal axis of a wordline may be at a non-90 degree angle with respect to the longitudinal axis of the bitline/plateline, which means that it is not parallel to any edges of the support structure since the support structure has a rectangular shape. In another example, the longitudinal axis of a wordline may be parallel to some edges of the support structure, but the longitudinal axis of a bitline/plateline may be at a non-90 degree angle with respect to the longitudinal axis of the wordline, which means that it is not parallel to any edges of the support structure. In yet another example, the longitudinal axis of a bitline/plateline may be perpendicular to the longitudinal axis of a wordline, but neither the longitudinal axis of the bitline/plateline nor the longitudinal axis of the wordline is parallel to any edges of the support structure. The vertical transistors of the diagonal memory as described herein may be hysteretic transistors and/or may be further coupled to hysteretic capacitors.

As used herein, the term "longitudinal axis" is used to describe a line along which a structure of an electrically conductive material extends, where the structure is an elongated structure meaning that its' length (a dimension measured along the longitudinal axis) is greater than either its' thickness (a dimension measured in a plane perpendicular to the longitudinal axis, along a direction that is substantially perpendicular to the support structure) or its' width (a dimension measured in a plane perpendicular to the longitudinal axis, along a direction that is substantially parallel to the support structure).

In the following, descriptions are provided with respect to bitlines being the control lines that wrap around portions of vertical transistors, in particular, that wrap around upper portions of vertical transistors, with the platelines being the control lines coupled to the bottom portions of the vertical transistors. However, in general, these descriptions are equally applicable to embodiments where the designations of bitlines and platelines are reversed (i.e., where platelines are the control lines that wrap around the upper portions of vertical transistors and with the bitlines are the control lines coupled to the bottom portions of the vertical transistors), all of which embodiments being within the scope of the present disclosure. In the context describing various layers in the present disclosure, the term "above" may refer to a layer being further away from a support structure of an IC device, while the term "below" refers to a layer being closer to the support structure. Although descriptions of the present disclosure may refer to logic devices or memory cells provided in a given layer, each layer of the IC devices described herein may also include other types of devices besides logic or memory devices described herein.

As used herein, a "memory state" (or, alternatively, a "logic state," a "state," or a "bit" value) of a memory cell refers to one of a finite number of states that the cell can have, e.g., logic states "1" and "0." When any of the memory cells as described herein use a hysteretic material such as a FE or an AFE material, in some embodiments, a logic state of the memory cell may be represented simply by presence or absence of polarization of a FE or an AFE material in a certain direction (for example, for a two-state memory where a memory cell can store one of only two logic states—one logic state representing the presence of polarization in a certain direction and the other logic state representing the absence of polarization in a certain direction). In other embodiments of memory cells that include hysteretic materials such as FE or AFE materials, a logic state of a memory cell may be represented by the amount of polarization of a FE or an AFE material in a certain direction (for a multi-state memory where a memory cell can store one of three or more logic states, where different logic states represent the presence of different amounts of polarization in a certain direction). When any of the memory cells as described herein use a charge-trapping hysteretic arrangement, in some embodiments, a logic state of a memory cell may be represented simply by presence or absence of charge trapped in a charge-trapping hysteretic arrangement (for example, for a two-state memory where a memory cell can store one of only two logic states—one logic state representing the presence of charge and the other logic state representing the absence of charge). In other embodiments of memory cells that include charge-trapping hysteretic arrangements, a logic state of a memory cell may be represented by the amount charge trapped in a charge-trapping hysteretic arrangement (for example, for a multistate memory where a memory cell can store one of three or more logic states, where different logic states represent the presence of different amounts of trapped charges). As used herein, "READ" and "WRITE" memory access or operations refer to, respectively, determining/sensing a logic state of a memory cell and programming/setting a logic state of a memory cell.

In the following detailed description, various aspects of the illustrative implementations may be described using terms commonly employed by those skilled in the art to convey the substance of their work to others skilled in the art. For example, in context of S/D regions, the term "region" may be used interchangeably with the terms "contact" and "terminal" of a transistor. In another example, as used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, analogous elements designated in the present drawings with different reference numerals after a dash, e.g., transistors 320-11, 320-12, and so on may be referred to together without the reference numerals after the dash, e.g., as "transistors 320." In order to not clutter the drawings, if multiple instances of certain elements are illustrated, only some of the elements may be labeled with a reference sign.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC devices implementing diagonal memory with vertical transistors and wrap-around control lines as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices implementing diagonal memory with vertical transistors and wrap-around control lines as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Figure 1A:
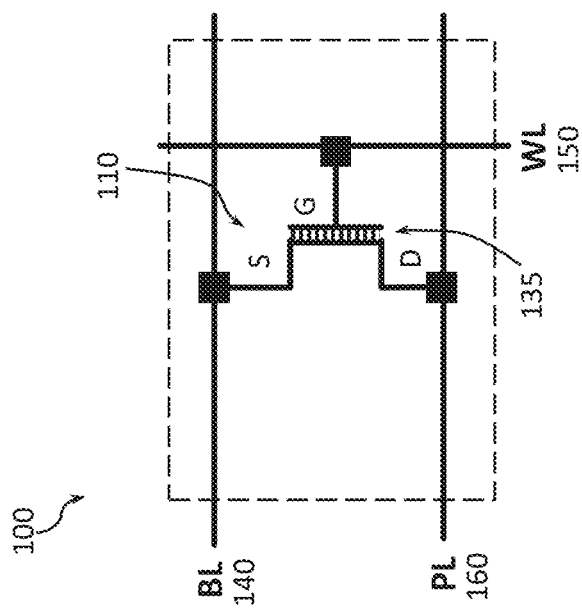

FIGS. 1A-1B are electric circuit diagrams of a hysteretic memory cell 100 that may be implemented using a vertical transistor 110 and a wrap-around bitline 140, according to some embodiments of the present disclosure. As shown in FIG. 1, the transistor 110 has a gate terminal, a source terminal, and a drain terminal, labeled in this and some of the other drawings as terminals G, S, and D, respectively. A bitline 140 (labeled in this and some of the other drawings as "BL"), a wordline 150 (labeled in this and some of the other drawings as "WL"), and a plateline 160 (labeled in this and some of the other drawings as "BL") are coupled to different terminals of the transistor 110.

As is commonly known, the designation of source and drain terminals in a transistor may be interchangeable in certain implementations. Therefore, while the example of FIG. 1 illustrates the bitline 140 to be coupled to a source terminal and the plateline 160 be coupled to a drain terminal, in other embodiments, this arrangement may be reversed. Together, source and drain terminals of a transistor may be referred to a "transistor terminal pair," where the individual ones of these two terminals may be referred to as a "first source or drain (S/D) terminal" and a "second S/D terminal" (e.g., if the first S/D terminal is a source terminal, then the second S/D terminal is a drain terminal, and vice versa). The same applies to S/D regions of the transistor 110 (i.e., the designation of source and drain regions of a transistor may be interchangeable), where, in general, S/D regions of a transistor (also sometimes interchangeably referred to as "diffusion regions") may be regions of doped semiconductors, e.g., regions of a doped channel material, so as to supply charge carriers for the transistor channel. Often, the S/D regions are highly doped, e.g., with dopant concentrations of about $1 \cdot 10^{21}$ dopants per cubic centimeter ($cm^{-3}$), in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the S/D regions of the transistor 110 may be the regions having dopant concentration higher than in other regions, e.g., higher than a dopant concentration in the transistor channel (i.e., in a channel material extending between the source region and the drain region), and, therefore, may be referred to as "highly doped" (HD) regions. The channel material of a transistor may include one or more semiconductor materials with doping concentrations significantly smaller than those of the S/D regions.

For example, in some embodiments, the channel material may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material of the transistor 110 are still significantly lower than the dopant level in the S/D regions, for example below $10^{15}$ $cm^{-3}$, or below $10^{13}$ $cm^{-3}$. Depending on the context, the term "S/D terminal" may refer to a S/D region or a S/D contact or electrode of a transistor.

In various embodiments, the transistor 110 may be any FET, e.g., the transistor 110 may be either an N-type metal-oxide-semiconductor (NMOS) transistor or a P-type metal-oxide-semiconductor (PMOS) transistor. In some embodiments particularly suitable for implementing vertical transistors as described herein, the transistor 110 may be a thin-film transistor (TFT). A TFT is a special kind of a FET made by depositing a thin film of an active semiconductor material, as well as a dielectric layer and conductive (e.g., metallic) contacts, over a supporting layer that may be a non-conductor layer and a non-semiconductor layer. At least a portion of the active semiconductor material forms a channel region/material of the TFT. This is different from conventional, non-TFT, front-end-of line (FEOL) transistors where the semiconductor channel material of a transistor is typically a part of a semiconductor substrate, e.g., a part of a silicon wafer, or is epitaxially grown on a semiconductor substrate. Using TFTs as transistors of memory cells provides several advantages and enables unique architectures that were not possible with conventional, FEOL logic transistors. For example, advantages include substantially lower leakage in TFTs than in logic transistors and lower temperature processing used to fabricate TFTs. In context of the present disclosure, the transistor 110 being a TFT advantageously allows depositing a thin-film channel material of the transistor 110 in a non-planar arrangement to realize vertical transistor architecture, as will be described in greater detail below.

The transistor 110 is different from conventional logic transistors in that, instead of or in addition to a gate dielectric material that may be included in the gate, the transistor 110 further includes a hysteretic material or a hysteretic arrangement, which, together, may be referred to as a "hysteretic element 135" (schematically illustrated in FIG. 1 as short parallel vertical lines integrated with the notation of the gate of the transistor 110). In this manner, the hysteretic element 135 of the memory cell 100 is integrated into the gate of the transistor 110 and the transistor 110 may be described as a "hysteretic transistor." The hysteretic element 135 integrated in the gate of the transistor 110 (or used as a capacitor insulator of a storage capacitor of a memory cell, described below with reference to FIG. 8 or FIG. 9, in which case the storage capacitor may be described as a "hysteretic capacitor") may have a thickness that may, in some embodiments, be between about 0.5 nanometers and 10 nanometers, including all values and ranges therein (e.g., between about 1 and 8 nanometers, or between about 0.5 and 5 nanometers).

In some embodiments, the hysteretic element 135 may be provided as a layer of an FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element 135 and are within the scope of the present disclosure.

In other embodiments, the hysteretic element 135 may be provided as a stack of alternating layers of materials that can trap charges. In some such embodiments, the stack may be a two-layer stack, where one layer is a charge-trapping layer and the other layer is a tunnelling layer. The tunnelling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a material that includes silicon and nitrogen (e.g., silicon nitride). In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects are desirable because charge-trapping may be used to represent different memory states of a memory cell.

In some embodiments of the hysteretic element 135 being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunnelling layer" while a layer of an insulator material on the other side of the charge-trapping layer may be referred to as a "field layer."

In various embodiments of the hysteretic element 135 being provided as a stack of alternating layers of materials that can trap charges, a thickness of each layer the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element 135 provided as a stack of alternating layers of materials that can trap charges (i.e., a hysteretic arrangement) may be between about 1 and 10 nanometers, e.g., between about 2 and 8 nanometers, e.g., about 6 nanometers.

Together, the bitline 140, the wordline 150, and the plateline 160 may be used to read and program the bit state of the memory cell 100 by, respectively, sensing and setting the polarization of the memory material 135. Each of the bitline 140, the wordline 150, and the plateline 160, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as copper, ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

The memory cell 100 shown in FIG. 1A and the memory cell 100 shown in FIG. 1B have identical connections between various elements shown, but differ in the relative orientations of bitlines 140, wordlines 150, and platelines 160. In particular, FIG. 1A illustrates an embodiment of the memory cell 100 where the plateline 160 is parallel to the bitline 140, while FIG. 1B illustrates an embodiment of the memory cell 100 where the plateline 160 is parallel to the bitline 140. Both FIGS. 1A and 1B illustrate embodiments of the memory cell 100 where the wordline 150 is perpendicular to the bitline 140. In some implementations, the relative orientations of bitlines 140, wordlines 150, and platelines 160 as shown in the electric circuit diagrams of the present drawings (e.g., FIGS. 1 and 2) may be representative of actual physical orientations of these control lines in the actual physical layout of the IC devices described herein. For example, in some implementations, the wordlines 150 may indeed be routed as metal lines substantially parallel to one another and substantially perpendicular to the bitlines 140, e.g., as shown with the embodiments of FIGS. 4A-4D. In another example, in some implementations, the platelines 160 may indeed be routed as metal lines substantially parallel to one another and to the bitlines 140. However, in other implementations, any of the bitlines 140, wordlines 150, and platelines 160 may be oriented in the actual physical layout of any of the IC devices described herein in any manner that allows realizing the electrical connections as described with reference to FIG. 1 and FIG. 2. For example, embodiments of FIGS. 5A-5C, FIGS. 6A-6B, and FIG. 7 illustrate that, while different wordlines 150 may be routed as metal lines substantially parallel to one another and while different bitlines 140 may be routed as metal lines substantially parallel to one another, the wordlines 150 are not physically perpendicular to the bitlines 140.

The memory cell 100 as shown in FIGS. 1A-1B is a "unit cell," where a plurality of such unit cells may be arranged in an array to implement a memory device. Each of the memory cells 100 as shown in FIGS. 1A-1B can be any one of the memory cells having the transistor 110 implemented as a vertical transistor and having the bitline 140 implemented as a wrap-around bitline as described herein.

Figure 2A:
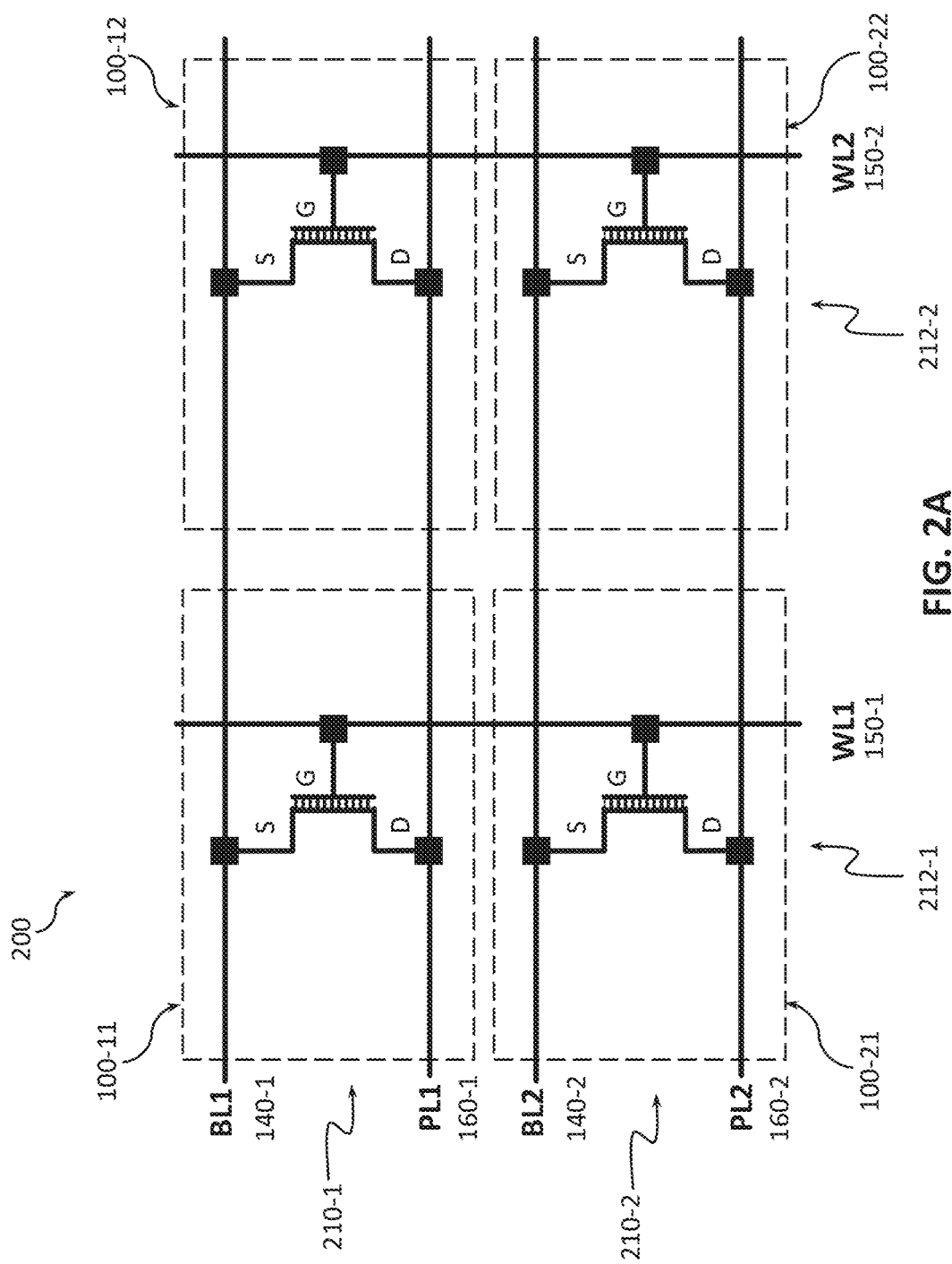
FIGS. 2A-2B are electric circuit diagrams of an array of a plurality of hysteretic memory cells of, respectively, FIG. 1A and FIG. 1B, according to some embodiments of the present disclosure.
Figure 2B:
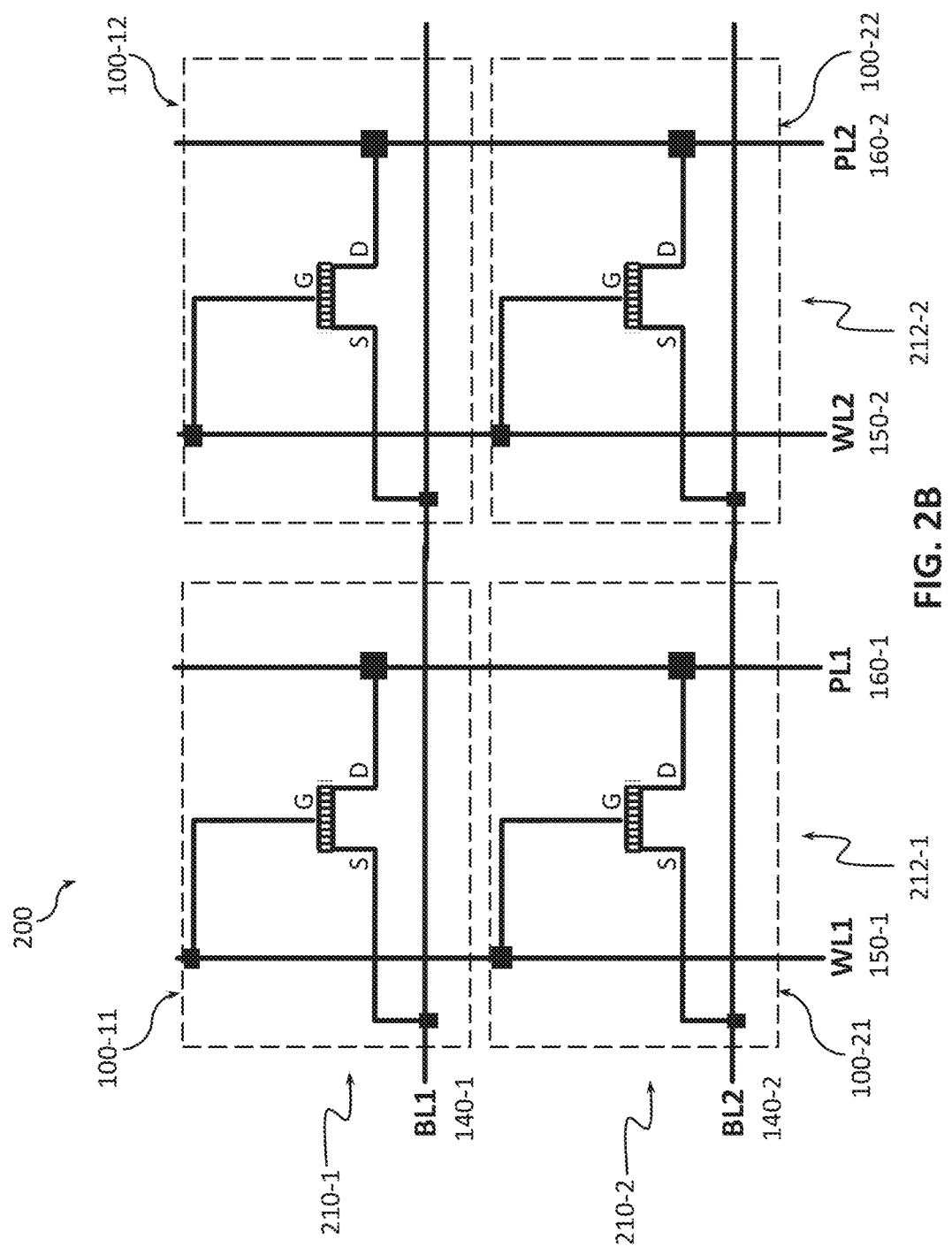

FIG. 2A provides a schematic illustration of a plurality of memory cells 100 of FIG. 1A, namely four cells, arranged in an array 200, according to some embodiments of the present disclosure. Similarly, FIG. 2B provides a schematic illustration of a plurality of memory cells 100 of FIG. 1B, namely four cells, arranged in an array 200, according to some embodiments of the present disclosure. Individual memory cells 100 of FIG. 1A are illustrated in FIG. 2A to be within one of the dashed boxes labeled 100-11, 100-12, 100-21, and 100-22, and the same applies to the individual memory cells 100 of FIG. 1B that are illustrated in FIG. 2B. While only four memory cells 100 are shown in each of FIG. 2A and FIG. 2B, in other embodiments, the array 200 of FIGS. 2A-2B may, and typically would, include many more memory cells. Furthermore, in other embodiments, the memory cells 100 may be arranged in arrays in a manner other than what is shown in FIGS. 2A-2B, e.g., in any suitable manner of arranging memory cells into arrays as known in the art, all of which being within the scope of the present disclosure.

In some embodiments of the memory array 200, each of the bitline 140, wordline 150, and plateline 160 coupled to one memory cell can be shared among multiple, possibly different subsets of, the memory cells 100 of a memory array. Each of FIGS. 2A-2B illustrates one such embodiment where, as shown, the bitline 140 can be shared among multiple memory cells 100 in a column 210, and each of the wordline 150 can be shared among multiple memory cells 100 in a row 212. As is conventionally used in context of memory, the terms "row" and "column" do not reflect the, respectively, horizontal and vertical orientation on a page of a drawing illustrating a memory array but, instead, reflect how individual memory cells are addressed. Namely, memory cells 100 sharing a single bitline are said to be in the same column, while memory cells sharing a single wordline are said to be on the same row. Thus, in FIGS. 2A-2B, the horizontal lines of the memory cells 100 are referred to as columns 210-1 and 210-2, while the vertical lines of the memory cells 110 refer to as rows 212-1 and 112-2. More specifically, as shown in FIGS. 2A-2B, the first column 210-1 includes the memory cells 100-11 and 100-12, each of which is coupled to the first bitline (BL1) 140-1; the second column 210-1 includes the memory cells 100-21 and 100-22, each of which is coupled to the second bitline (BL2) 140-2, the first row 212-1 includes the memory cells 100-11 and 100-21, each of which is coupled to the first wordline (WL1) 140-1, and the second row 212-2 includes the memory cells 100-12 and 100-22, each of which is coupled to the second wordline (WL2) 140-2.

FIGS. 2A and 2B differ in how the platelines 160 are shared among different memory cells 100 of the memory arrays 200.

In particular, FIG. 2A illustrates an embodiment where a single plateline 160 may be shared among multiple memory cells of a given column 210. For example, FIG. 2A illustrates that the PL1 is shared among memory cells 100-11 and 100-12 of the column 210-1, while the PL2 is shared among memory cells 100-21 and 100-22 of the column 210-2. As described above, the BL1 is shared among memory cells 100-11 and 100-12 of the column 210-1, while the BL2 is shared among memory cells 100-21 and 100-22 of the column 210-2. Thus, in FIG. 2A, the platelines 160 are shared among the same memory cells among which the bitlines 140 are shared. Such an arrangement where the platelines 160 are shared among the same memory cells among which the bitlines 140 are shared may be described as an arrangement where the platelines 160 are "parallel" to the bitlines 140. Each memory cell 100 of the memory array 200 where the platelines 160 are parallel to the bitlines 140, e.g., as shown in FIG. 2A, may then be addressed (e.g., to perform READ and WRITE operations) by using the bitline 140 and the plateline 160 corresponding to the column 210 to which the memory cell 100 belongs and by using the wordline 150 corresponding to the row 212 to which the memory cell 100 belongs. For example, the memory array 200 of FIG. 2A, the memory cell 100-11 is controlled by WL1, BL1, and PL1, the memory cell 100-12 is controlled by WL2, BL1, and PL1, the memory cell 100-21 is controlled by WL1, BL2, and PL2, and the memory cell 100-22 is controlled by WL2, BL2, and PL2.

On the other hand, FIG. 2B illustrates an embodiment where a single plateline 160 may be shared among multiple memory cells of a given row 212. For example, FIG. 2B illustrates that the PL1 is shared among memory cells 100-11 and 100-21 of the row 212-1, while the PL2 is shared among memory cells 100-12 and 100-22 of the row 212-2. As described above, the WL1 is shared among memory cells 100-11 and 100-21 of the row 212-1, while the WL2 is shared among memory cells 100-12 and 100-22 of the row 212-2. Thus, in FIG. 2B, the platelines 160 are shared among the same memory cells among which the wordlines 150 are shared. Such an arrangement where the platelines 160 are shared among the same memory cells among which the wordlines 150 are shared may be described as an arrangement where the platelines 160 are "parallel" to the wordlines 150. Each memory cell 100 of the memory array 200 where the platelines 160 are parallel to the wordlines 150, e.g., as shown in FIG. 2B, may then be addressed (e.g., to perform READ and WRITE operations) by using the wordline 150 and the plateline 160 corresponding to the row 212 to which the memory cell 100 belongs and by using the bitline 140 corresponding to the column 210 to which the memory cell 100 belongs. For example, the memory array 200 of FIG. 2B, the memory cell 100-11 is controlled by WL1, PL1, and BL1, the memory cell 100-12 is controlled by WL2, PL2, and BL1, the memory cell 100-21 is controlled by WL1, PL1, and BL2, and the memory cell 100-22 is controlled by WL2, PL2, and BL2.

It should be noted that, just as the horizontal and vertical orientations on a page of an electrical circuit diagram illustrating a memory array does imply functional division of memory cells into rows and columns as used in common language, the orientation of various elements on a page of an electrical circuit diagram illustrating a memory array does not imply that the same orientation is used for the actual physical layout of a memory array. For example, in an IC device implementing the memory array 200 as shown in FIG. 2A, corresponding bitlines 140 and platelines 150 (i.e., a pair of a bitline 140 and a plateline 160 coupled to a given column 210) do not have to physically extend in a direction parallel to one another (although they may), or the wordlines 150 do not have to physically extend in a direction perpendicular to the bitlines 140 (although they may). In another example, in an IC device implementing the memory array 200 as shown in FIG. 2B, corresponding wordlines 150 and platelines 150 (i.e., a pair of a wordline 150 and a plateline 160 coupled to a given row 212) do not have to physically extend in a direction parallel to one another (although they may), or the wordlines 150 do not have to physically extend in a direction perpendicular to the bitlines 140 (although they may).

While FIGS. 1 and 2 provide schematic illustrations where the memory cells 100 are shown using their electrical circuit representations, FIGS. 3-9 provide various views of example physical layouts of IC devices that may implement such memory cells according to various embodiments of the present disclosure. A number of elements labeled in FIGS. 3-9 with reference numerals are indicated in FIGS. 3-9 with different patterns in order to not clutter the drawings with too many reference numerals, with a legend showing the correspondence between the reference numerals and patterns being provided at the bottom or on the side of FIGS. 3-9. For example, the legend illustrates that FIGS. 3-9 use different patterns to show a support structure 302, a gate electrode material 304, a channel material 306, S/D regions 308, a gate insulator material 310, an insulator material 312, etc. Although the illustrations of FIGS. 3-9 show embodiments where the platelines 160 are parallel to the bitlines 140, the same descriptions apply to embodiments where the platelines 160 are parallel to the wordlines 150, with necessary modifications to the illustrations of FIGS. 3-9 being apparent in view of the descriptions provided herein. Therefore, unless specified otherwise, descriptions provided with respect to FIGS. 3-9 are applicable to the physical layouts of the IC devices where the platelines 160 are parallel to the bitlines 140 as well as to the embodiments where the platelines 160 are parallel to the wordlines 150, all such embodiments of different physical layouts being within the scope of the present disclosure.

FIGS. 3A-3C provide various views of an example IC device 300 that may be used to implement a hysteretic memory cell 100 of FIG. 1A with a vertical transistor 320 and a wrap-around bitline 340, according to some embodiments of the present disclosure. In particular, FIG. 3B illustrates a cross-section of the IC device 300 taken along the section/plane B-B of FIGS. 3A and 3C, and FIG. 3C illustrates a cross-section of the IC device 300 taken along the section/plane C-C of FIG. 3A, while FIG. 3A illustrates a cross-section of the IC device 300 taken along the section/plane A-A of FIGS. 3B and 3C. With reference to an example coordinate system x-y-z that may be used to provide different views of an IC device, FIGS. 3A and 3C provide cross-sectional side views across planes x-z and y-z, respectively, while FIG. 3B provides a top-down view across a plane x-y, with a number of components not shown in the top-down view of FIG. 3B to more readily illustrate how the gate of the transistor 320 of the IC device 300 may be arranged.

As shown in FIG. 3, the IC device 300 includes a support structure 302, over which the transistor 320 may be provided. In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. Although a few examples of materials from which the substrate may be formed are described here, any material that may serve as a foundation upon which a semiconductor device may be built falls within the spirit and scope of the present disclosure. In various embodiments, the support structure 302 may include any such substrate that provides a suitable surface for providing the IC device with the memory cell 100. In some embodiments, the support structure 302 may be the wafer 2000 of FIG. 10, discussed below, and may be, or be included in, a die, e.g., the singulated die 2002 of FIG. 10, discussed below. In some embodiments, the support structure 302 may be a printed circuit board (PCB) substrate.

A portion of the IC device 300 within a rectangular dashed contour shown in FIG. 3A indicates an approximate outline of the transistor 320. As shown in FIG. 3, the transistor 320 may include a gate electrode material 304, a channel material 306, and a pair of S/D regions 308 provided in the channel material 306. As also shown in FIG. 3, a gate insulator material 310 may be integrated with the gate of the transistor 320 by being provided between the gate electrode material 304 and the channel material 306. FIG. 3 further illustrates an insulator material 312 that may surround various portions of the transistor 320 to provide electrical isolation between portions of the IC device 300. FIG. 3 also illustrates a bitline 340 (which may be an example of the bitline 140, described above), a wordline 350 (which may be an example of the wordline 150, described above), and a plateline 360 (which may be an example of the plateline 160, described above). As shown in FIG. 3, the wordline 350 is electrically coupled to (e.g., in conductive contact with) the gate electrode material 304 of the transistor 320 (e.g., in some embodiments, the wordline 350 may serve as a contact to the gate of the transistor 320), but is electrically separated from the channel material 306 by means of a spacer material 314. As also shown in FIG. 3, the plateline 360 is electrically coupled to (e.g., in conductive contact with) the first S/D region 308-1 of the pair of the S/D regions 308 of the transistor 320 (e.g., in some embodiments, the plateline 360 may serve as a contact to the first S/D region 308-1). FIG. 3 further illustrates that the bitline 340 is electrically coupled to (e.g., in conductive contact with) the second S/D region 308-2 of the pair of the S/D regions 308 of the transistor 320 (e.g., in some embodiments, the bitline 360 may serve as a contact to the second S/D region 308-2). The transistor 320 may be an example of the transistor 110, described above.

The gate electrode material 304 may include at least one P-type work function metal or N-type work function metal, depending on whether the transistor 320 is a PMOS transistor or an NMOS transistor (P-type work function metal used as a gate electrode material when the transistor 320 is a PMOS transistor and N-type work function metal used as a gate electrode material when the transistor 320 is an NMOS transistor). For a PMOS transistor, metals that may be used for the gate electrode material 304 may include, but are not limited to, ruthenium, palladium, platinum, cobalt, nickel, and conductive metal oxides (e.g., ruthenium oxide). For an NMOS transistor, metals that may be used for a gate electrode material 304 may include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, a gate electrode material 304 may include a stack of two or more metal layers, where one or more metal layers are work function metal layers and at least one metal layer is a fill metal layer. Further layers may be included next to a gate electrode material 304 for other purposes, such as to act as a diffusion barrier layer or/and an adhesion layer.

The channel material 306 may be composed of semiconductor material systems including, for example, N-type or P-type materials systems. In particular, the channel material 306 may be formed of a thin-film material. Some such materials may be deposited at relatively low temperatures, which allows depositing them within the thermal budgets imposed on back end fabrication to avoid damaging the frontend components (not specifically shown in FIG. 3) of the IC device 300. In some embodiments, the channel material 306 may have a thickness between about 1 and 75 nanometers, e.g., between about 1 nanometers and 10 nanometers or between about 5 nanometers and 30 nanometers, including all values and ranges therein. In some embodiments, the channel material 306 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material 306 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous, polymorphous, or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

Whether the channel material 306 is a thin-film channel material, as opposed to an epitaxially grown semiconductor material that may be included in the IC device by layer transfer, may be identified by inspecting grain size of the channel material 306. An average grain size of the channel material 306 being between about 0.5 and 1 millimeters (in which case the material may be considered to be polycrystalline) or smaller than about 0.5 millimeter (in which case the material may be considered to be polymorphous or amorphous) may be indicative of the channel material 306 being a thin-film material deposited onto portions of the IC device 300 and not epitaxially grown. On the other hand, an average grain size of the channel material 306 being equal to or greater than about 1 millimeter (in which case the material may be considered to be a single-crystalline material) may be indicative of the channel material 306 having been included in the IC device 300 by layer transfer. In the embodiments where the channel material 306 is a single-crystalline semiconductor material, it may include any of the materials described above that may be provided in a single-crystalline form.

As described above, S/D regions 308 may be regions of doped semiconductors, e.g., regions of a doped channel material, so as to supply charge carriers for the transistor channel. The S/D regions 308 may generally be formed using either an implantation/diffusion process or an etching/deposition process. In the former process, dopants such as boron, aluminum, antimony, phosphorous, or arsenic may be ion-implanted into the channel material to form the S/D regions 308 in the channel material 306. An annealing process that activates the dopants and causes them to diffuse further into the channel material 306 typically follows the ion implantation process. In the latter process, the channel material 306 may first be etched to form recesses at the locations of the S/D regions 308. An epitaxial deposition process may then be carried out to fill the recesses with material that is used to fabricate the S/D regions 308. In some implementations, the S/D regions 308 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 308 may be formed using one or more alternate semiconductor materials such as germanium or a group III-V material or alloy. And in further embodiments, one or more layers of metal and/or metal alloys may be used to form the S/D regions 308.

The gate insulator material 310 is provided between the gate electrode material 304 and the channel material 306. In some embodiments, the gate insulator material 310 may be a high-k dielectric material typically used in logic transistors and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material of the IC device 300 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, scandium aluminum nitride, tantalum oxide, tantalum silicon oxide, lead scandium tantalum oxide, and lead zinc niobate. In some embodiments, an annealing process may be carried out on the gate dielectric material during manufacture of the IC device 300 to improve the quality of the gate dielectric. In some embodiments, the gate dielectric included in the gate stack of the transistor 320 may have a thickness between about 0.5 nanometers and 3 nanometers, including all values and ranges therein, e.g., between about 1 and 3 nanometers, or between about 1 and 2 nanometers. In some embodiments, the gate insulator material 310 may include the hysteretic element 135 as described above, instead of, or in addition to, a high-k dielectric material as used in logic transistors.

Although also not shown in the present drawings, in some embodiments of the IC device 300, the transistor 320 may further include an intermediate material between at least a portion of the gate insulator material 310 and at least a portion of the channel material 306. Such an intermediate material may include any non-conductive material, and may be provided to address endurance issues that may arise due to charging at the interface between the gate insulator material 310 and the channel material 306 that may take place if the gate insulator material 310 directly interfaces the channel material 306.

The insulator material 312 may include any suitable interlayer dielectric (ILD) material for providing electrical isolation between portions of the IC device 300. In various embodiments, the insulator material 312 may include materials such as silicon oxide, carbon-doped silicon oxide, silicon carbide, silicon nitride, silicon oxynitride, aluminum oxide, organic polymers such as perfluorocyclobutane or polytetrafluoroethylene, fluorosilicate glass (FSG), and organosilicates such as silsesquioxane, siloxane, or organosilicate glass. In some embodiments, the insulator material 312 may be a low-k dielectric. In some embodiments, the insulator material 312 may include pores or air gaps to further reduce its dielectric constant. The spacer material 314 may also include any such ILD material for providing electrical isolation between the wordline 350 and the channel material 306.

Turning to the details of the vertical nature of the transistor 320, as shown in FIG. 3, each of the channel material 306 and the gate insulator material 310 includes portions that may be referred to as "sidewall portions" because they are substantially perpendicular to the support structure 302. As further shown in FIG. 3, each of the channel material 306 and the gate insulator material 310 includes a portion that may be referred to as a "middle horizontal portion" because it is in between the sidewall portions (i.e., in the middle) and is substantially parallel to the support structure 302 (such a portion may also be referred to as a "bottom portion" or, simply, a "bottom" because it is at the bottom of the opening in the insulator material 312, i.e., closest to the support structure 302). The first and second sidewall portions of the channel material 306 are labeled in FIG. 3 as, respectively, portions 316-1 and 316-2, and the middle horizontal portion of the channel material 306 is labeled in FIG. 3 as a portion 316-3. Similarly, the first and second sidewall portions of the gate insulator material 310 are labeled in FIG. 3 as, respectively, portions 322-1 and 322-2, and the middle horizontal portion of the gate insulator material 310 is labeled in FIG. 3 as a portion 322-3. As shown in FIG. 3, the middle horizontal portion 322-3 is between the middle horizontal portion 316-3 and the gate electrode material 304, the first sidewall portion 322-1 is between the first sidewall portion 316-1 and the gate electrode material 304, and the second sidewall portion 322-2 is between the second sidewall portion 316-2 and the gate electrode material 304.

The different portions 316 of the channel material 306 form a continuous layer of the channel material 306, starting from the first sidewall portion 316-1, continuing with the middle horizontal portion 316-3, and further continuing with the second sidewall portion 316-2. Thus, a continuous channel region is provided between the first S/D region 308-1 and the second S/D region 308-2. Similarly, the different portions 322 of the gate insulator material 310 form a continuous layer of the gate insulator material 310, starting from the first sidewall portion 322-1, continuing with the middle horizontal portion 322-3, and further continuing with the second sidewall portion 322-2. Thus, the gate insulator material 310 is provided continuously along the channel material 306, between the channel material 306 and the gate electrode material 304, where the channel material 306 may be conformal to the shape of the gate insulator material 310.

As shown in FIG. 3, the gate insulator material 310 is non-planar in that it includes bends/corners. In particular, each of the gate insulator material 310 and the channel material 306 of the IC device 300 may be seen as a U-shaped structure. The IC device 300 may then be described as having a gate that includes a U-shaped structure of the gate insulator material 310. Because the channel material 306 is conformal to the shape of the gate insulator material 310, the channel material 306 is non-planar as well and includes bends/corners corresponding to those of the gate insulator material 310. In regions where the gate insulator material 310 bends (i.e., at the corners of the gate insulator material 310), the electric field may be higher and, therefore, it may be easier to switch the memory state of the gate insulator material 310 if the gate insulator material 310 includes the hysteretic element 135.

The transistor 320 as shown in FIG. 3 is a vertical transistor because the first S/D contact, provided by one of the control lines (e.g., the plateline 360) is at the bottom of the transistor 320 (i.e., closer to the support structure 302), while the second S/D contact, provided by another one of the control lines (e.g., the bitline 340) is proximate to the top of the transistor 320 (i.e., further away from the support structure 302). Such a vertical transistor architecture may enable increasing the effective gate length (Leff) of the transistor 320 without substantially increasing its footprint over the support structure 302. Increased effective gate length may help reduce device-to-device variations and decrease the current in the off-state (Ioff) of the transistor (i.e., leakage current). Furthermore, as can be seen from the top-down cross-section of FIG. 3B, one of the control lines that is proximate to the top of the transistor 320 (e.g., the bitline 340) may wrap-around the opening in the insulator material 312 in which the transistor 320 is provided, enabling lower contact resistance and resulting in higher currents.

Figure 4A:
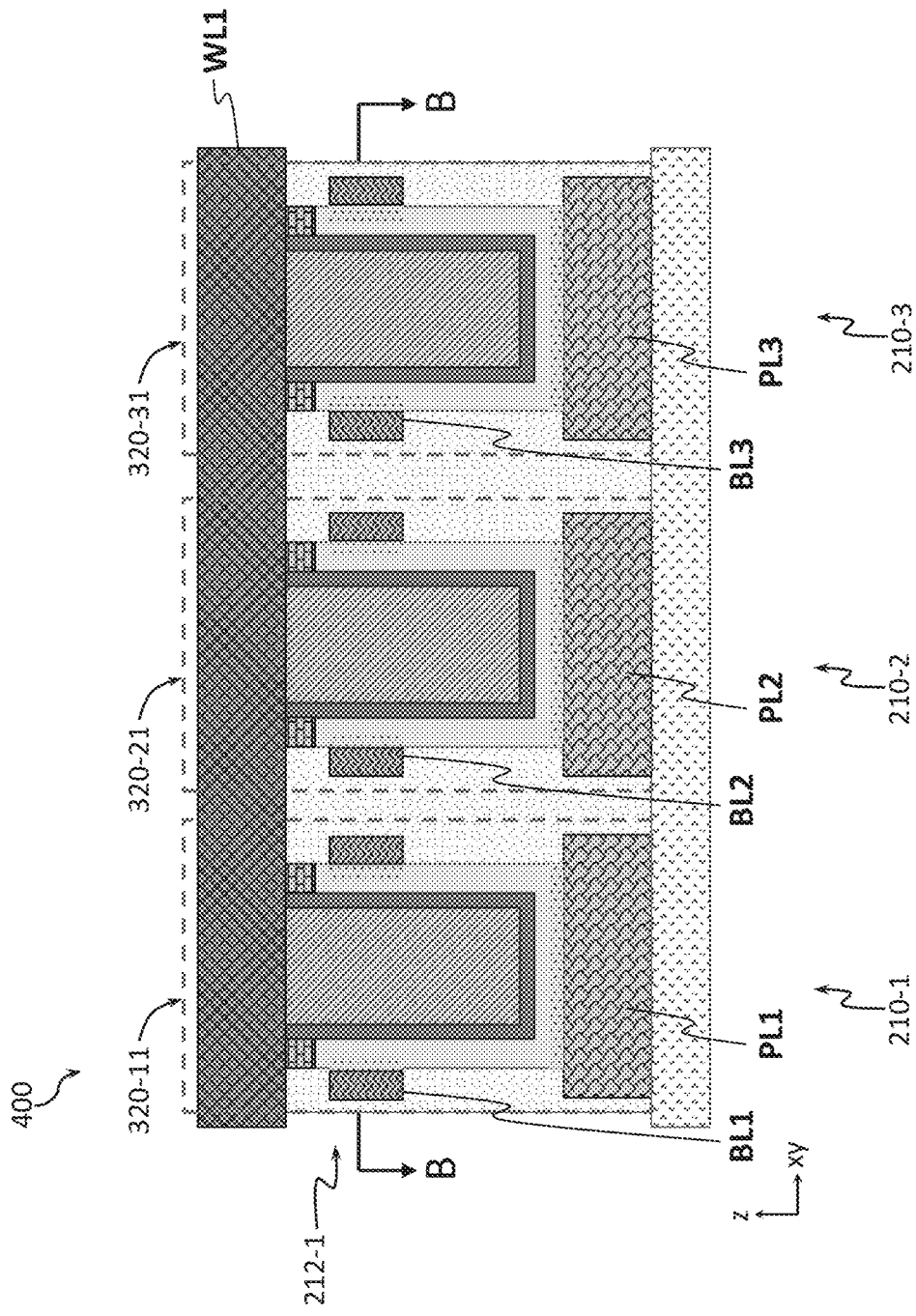
FIGS. 4A-4D provide various views of an example IC device implementing an array of a plurality of memory cells with the vertical transistors and wrap-around bitlines implemented as shown in FIG. 3, where bitlines and wordlines are physically orthogonal to one another but not parallel to the edges of a support structure on which they are provided, according to some embodiments of the present disclosure.
Figure 4B:
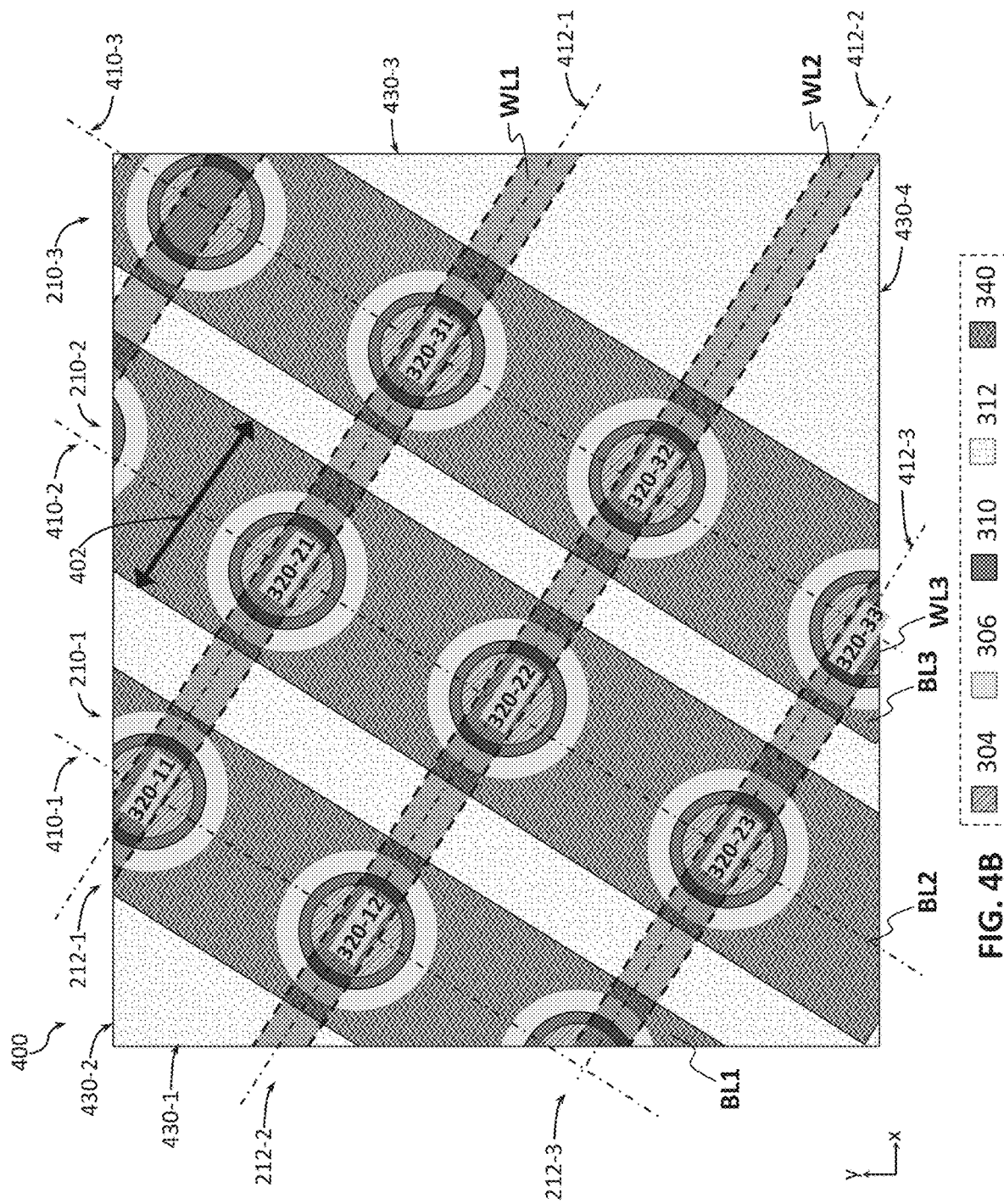
Figure 4C:
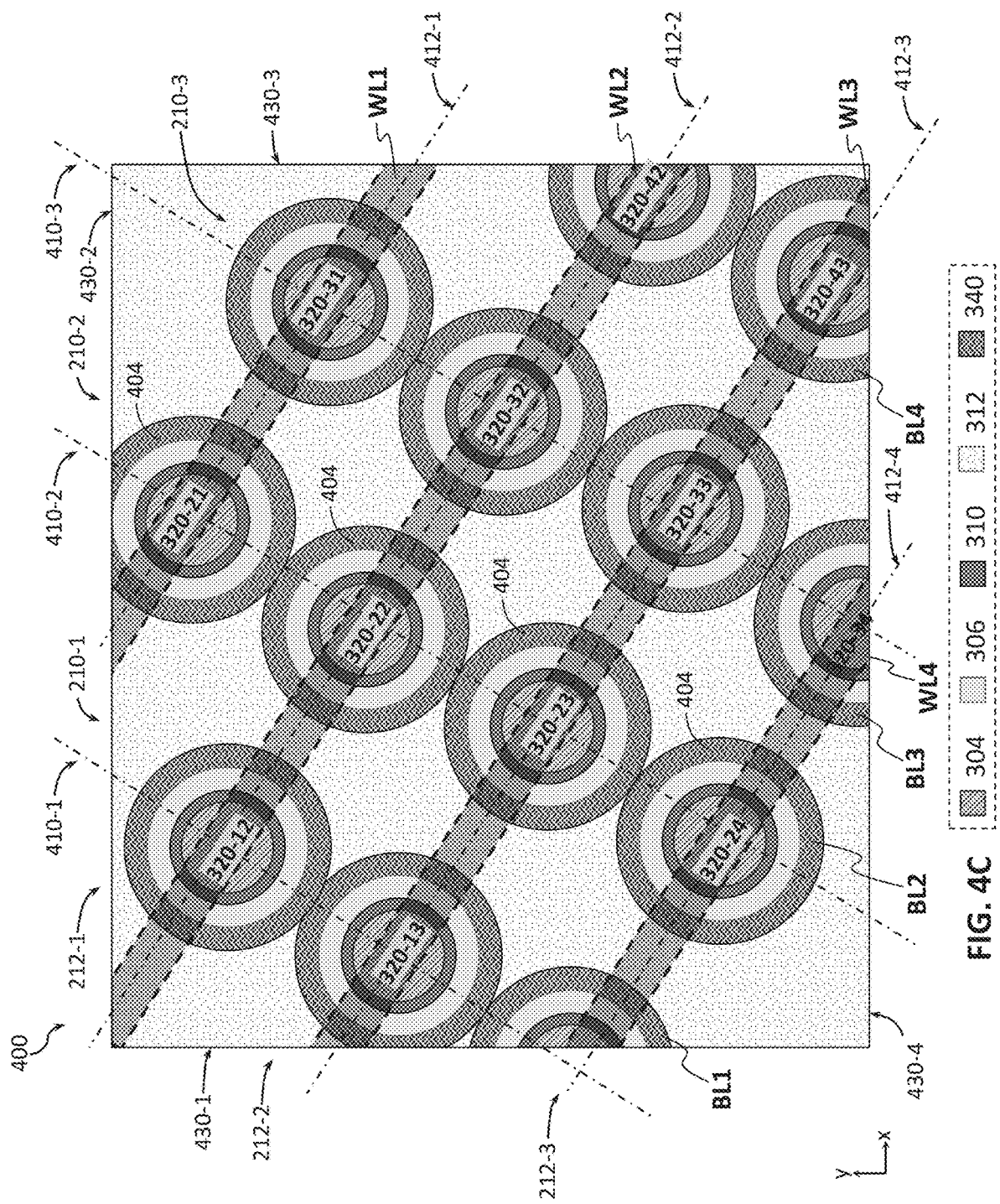
Figure 4D:
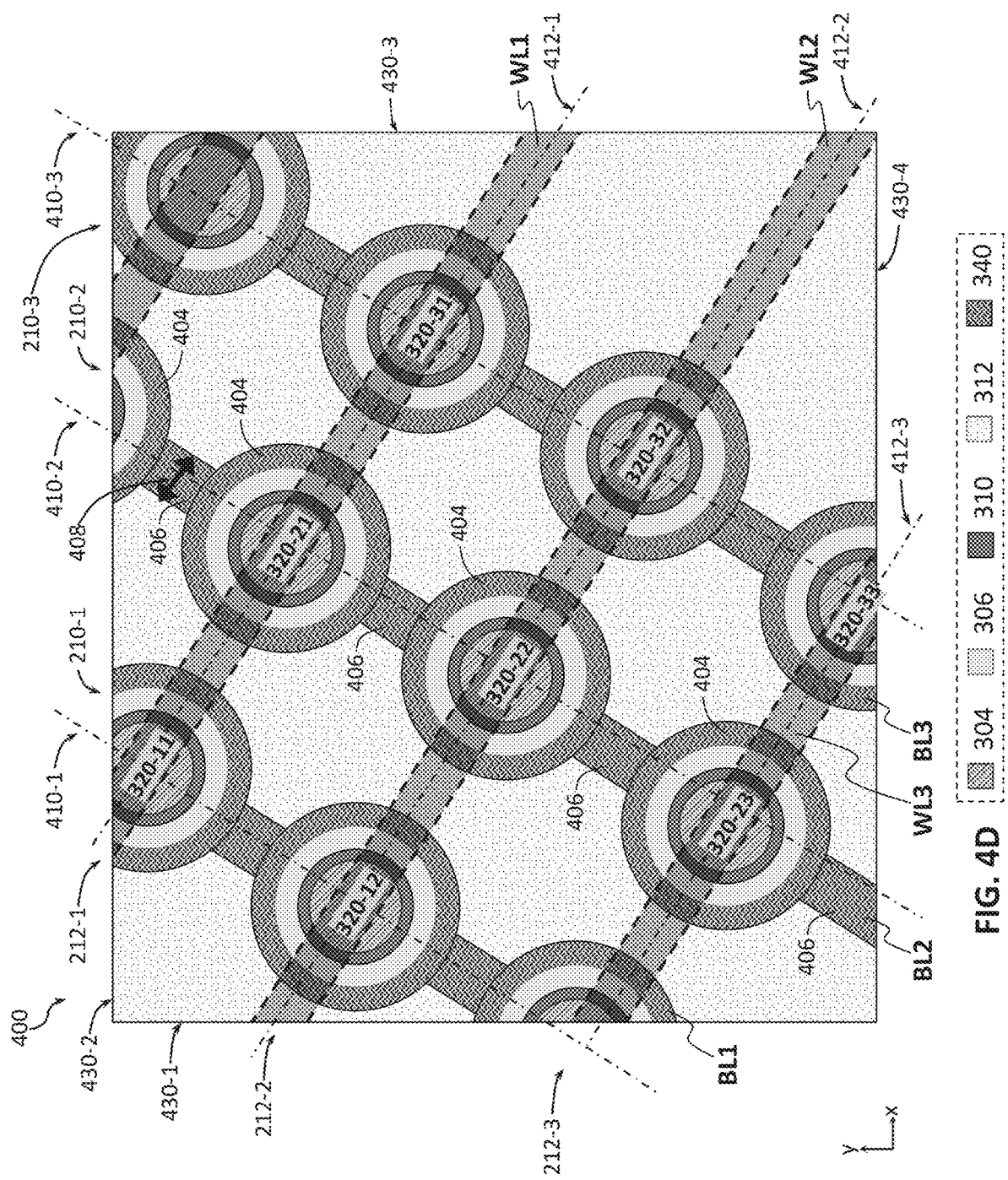

FIGS. 4A-4D provide various views of an example IC device 400 implementing an array of a plurality of memory cells with the vertical transistors 320 and the wrap-around bitlines 340 implemented as shown in FIG. 3, where the bitlines 340 and the wordlines 350 are physically orthogonal to one another but not parallel to the edges of the support structure 302 on which they are provided, according to some embodiments of the present disclosure. In particular, each of FIGS. 4B-4D illustrates a cross-section of the IC device 400 taken along the section/plane B-B of FIG. 4A according to different embodiments. On the other hand, FIG. 4A illustrates a cross-section of the IC device 400 taken along a plane that is substantially perpendicular to the support structure 302 and contains the longitudinal axis of one of the wordlines 350 (e.g., WL1) of any of FIGS. 4B-4D. FIG. 4A labels the horizontal axis of the example coordinate system shown as "xy" to indicate that this axis does not necessarily aligns with either the x-axis or the y-axis of the example coordinate system x-y-z that was used in FIGS. 3A-3C or in FIG. 4A, but could be any line in the x-y plane of such a coordinate system. Otherwise, FIGS. 4A-4D use the same example coordinate system x-y-z that was used in FIGS. 3A-3C, where FIG. 4A provides a cross-sectional side view, while each of FIGS. 4B-4D provides a top-down view across a plane x-y, with a number of components not shown in the top-down views of FIGS. 4B-4D in order to more readily illustrate how the bitlines 340 and the wordlines 350 of different transistors 320 of the IC device 400 may be arranged.

In FIG. 4, the same labeling of different instances of the bitlines 140, the wordlines 150, and the platelines 160 is used as that of FIG. 2, except that the bitlines 140, the wordlines 150, and the platelines 160 are shown in FIG. 4 as bitlines 340, the wordlines 350, and the platelines 360, respectively. Otherwise, different instances of the bitlines 340 are the labeled as in FIG. 4 as in FIG. 2, i.e., as BL1, BL2, and so on; different instances of the wordlines 350 are the labeled as in FIG. 4 as in FIG. 2, i.e., as WL1, WL2, and so on (in FIGS. 4B-4D, the wordlines 350 are shown as semi-transparent overlays over other elements of the IC device 400 shown in these drawings because these views are of the cross-sections along the plane B-B which is below the plane of the wordlines 350, so, strictly speaking, the wordlines 350 would not be seen in a cross-section along the plane B-B); and different instances of the platelines 340 are the labeled as in FIG. 4 as in FIG. 2, i.e., as PL1, PL2, and so on. Furthermore, different columns 210 and rows 212 are labeled in FIG. 4, those also corresponding to the convention used in FIG. 2, described above. Still further, individual instances of some of the transistors 320 of the IC device 400 are labeled in FIG. 4 with a two-digit reference numeral after the dash after the reference numeral "320" (i.e., each transistor 320 may be labeled as "320-ij" where i is the first digit and j is the second digit of the two-digit reference numeral identifying an individual instance of the transistor 320). The individual transistors 320-ij are labeled in FIG. 4 with a reference numeral overlaid over the gate electrode material 304 of the transistors. The notation of the two-digit reference numerals used in FIG. 4 for the transistors 320 is the same as that used in FIG. 1 for the individual instances of the memory cells 100, representing that each of the transistors 320 shown in FIG. 4 may be the transistor 110 of the memory cells of the array 200 of FIG. 2. The first digit of the two-digit reference numerals used in FIG. 4 for the transistors 320 represents the number of the column 210 (i.e., the digit i identifies an individual instance of the column 210, a column 210-*i*) to which the memory cell 100 with the transistor 320 belongs, while the second digit of the two-digit reference numerals used in FIG. 4 for the transistors 320 represents the number of the row 212 (i.e., the digit j identifies an individual instance of the row 212, a row 212-*j*) to which the memory cell 100 with the transistor 320 belongs.

FIG. 4A illustrates an example of the row 212-1 that may include transistors 320-11, 320-21, 320-31, and so on, coupled to a shared wordline 350, WL1. Each of these transistors may be coupled to a respective (i.e., different) bitline 340, as illustrated in FIG. 4A with the transistor 320-11 being coupled to the bitline BL1, the transistor 320-21 being coupled to the bitline BL2, the transistor 320-31 being coupled to the bitline BL3, and so on. Because FIG. 4 illustrates the embodiment where the platelines 360 are parallel to the bitlines 340, FIG. 4A further shows that each of the transistors 320 is coupled to a respective (i.e., different) plateline 360, as illustrated in FIG. 4A with the transistor 320-11 being coupled to the plateline PL1, the transistor 320-21 being coupled to the plateline PL2, the transistor 320-31 being coupled to the plateline PL3, and so on. Each of FIGS. 4B-4D illustrates different instances of columns 210 and different instances of rows 212, although not all of the transistors 320 are individually labeled in order to not clutter these drawings.

As shown in FIG. 4, in the row 212-*j*, each of these transistors is associated with a respective different pair of a bitline 340 and a plateline 360 of different columns 210-*i*. Thus, for a given row 212-*j*, the transistor 320-1*j* is associated with a bitline BL1 and a plateline PL1 of the column 210-1, the transistor 320-2*j* is associated with a bitline BL2 and a plateline PL2 of the column 210-2, the transistor 320-3*j* is associated with a bitline BL3 and a plateline PL3 of the column 210-3, and so on. As also shown in FIG. 4, in the column 210-*i*, each of these transistors is associated with a respective different wordline 350 of different rows 212-*j*. Thus, for a given column 210-*i*, the transistor 320-*i*1 is associated with a wordline WL1 of the row 212-1, the transistor 320-*i*2 is associated with a wordline WL2 of the row 212-2, the transistor 320-*i*3 is associated with a wordline WL3 of the row 212-3, and so on.

In the IC device 400, each of the individual bitlines 340 extends along a respective longitudinal axis 410-*i* corresponding to the column 210-*i*, shown in FIGS. 4B-4D as respective dash-dotted lines illustrating a longitudinal axis 410-1 for the BL1 of the column 210-1, a longitudinal axis 410-2 for the BL2 of the column 210-2, a longitudinal axis 410-3 for the BL3 of the column 210-3, and so on. Furthermore, each of the individual wordlines 350 extends along a respective longitudinal axis 412-*j* corresponding to the row 212-*j*, shown in FIGS. 4B-4D as respective dash-dotted lines illustrating a longitudinal axis 412-1 for the WL1 of the row 212-1, a longitudinal axis 412-2 for the WL2 of the row 212-2, a longitudinal axis 412-3 for the WL3 of the row 212-3, and so on. As shown in FIGS. 4B-4D, in some embodiments of the physical layouts of an IC device, e.g., of the IC device 400, the vertical transistors 320 coupled to the bitline BL1 of the column 210-1 may be physically arranged along the axis 410-1, the vertical transistors 320 coupled to the bitline BL2 of the column 210-2 may be physically arranged along the axis 410-2, the vertical transistors 320 coupled to the bitline BL3 of the column 210-3 may be physically arranged along the axis 410-3, and so on. Similarly, the vertical transistors 320 coupled to the wordline WL1 of the row 212-1 may be physically arranged along the axis 412-1, the vertical transistors 320 coupled to the wordline WL2 of the row 212-1 may be physically arranged along the axis 412-2, the vertical transistors 320 coupled to the wordline WL3 of the row 212-3 may be physically arranged along the axis 412-3, and so on. In the IC device 400, different ones of the axes 410 may be substantially parallel to one another and different ones of the axes 412 may be substantially parallel to one another, as shown in FIGS. 4B-4D. Furthermore, the IC device 400 illustrates embodiments where projections of the axes 410 onto a plane of the support structure 302 and analogous projections of the axes 412 are substantially perpendicular to one another, but neither the axes 410 nor the axes 412 are parallel to any edges 430 of the support structure 302. In this context, "projections" onto the plane of the support structure 302 are discussed when discussing angles between the axes 410 and the axes 412 because these axes are not in the same x-y plane with respect to the support structure 302 because the bitlines 340 and the wordlines 350 are not in the same x-y plane with respect to the support structure 302. The individual edges 430 are labeled in FIGS. 4B-4D as edges 430-1, 430-2, 430-3, and 430-3, where the edges 430-1 and 430-3 are parallel to one another, the edges 430-2 and 430-4 are parallel to one another, and the edges 430-1 and 430-3 are perpendicular to the edges 430-2 and FIG. 4B illustrates an embodiment where each individual bitline 340 may extend, along a respective longitudinal axis 410-*i*, as an electrically continuous conductive structure of a substantially constant width 402 (a dimension labeled in FIG. 4B only for the BL2 in order to not clutter the drawing by providing the same labels for each of the BLs shown) to wrap around all of the second S/D regions 308-2 of the different transistors 320 of a given column 210-*i* (e.g., of transistors 320-*i*1, 320-*i*2, 320-*i*3, and so on). On the other hand, FIG. 4C illustrates an embodiment alternative to FIG. 4B, where, similar to FIG. 4B, each individual bitline 340 still extends, along a respective longitudinal axis 410-*i*, as an electrically continuous conductive structure to wrap around all of the second S/D regions 308-2 of the different transistors 320 of a given column 210-*i*, but each individual bitline 340 includes portions 404 of the bitlines 340 that wrap around the second S/D regions 308-2 of the different transistors 320 of a given column 210-*i* that are in conductive contact with one another. In order to not clutter the drawings, the portions 404 are only labeled for the column 210-2 in FIG. 4C, but analogous elements are illustrated in other columns 210 shown in FIG. 4C. In some embodiments, all of the portions 404 may include an electrically conductive material of substantially the same material composition; in other embodiments, material compositions of the materials of different ones of the portions 404 may be different. FIG. 4D illustrates another embodiment alternative to FIG. 4B and alternative to FIG. 4C, where, similar to FIG. 4B and FIG. 4C, each individual bitline 340 still extends, along a respective longitudinal axis 410-*i*, as an electrically continuous conductive structure to wrap around all of the second S/D regions 308-2 of the different transistors 320 of a given column 210-*i*, but the portions 404 of the bitlines 340 that wrap around the second S/D regions 308-2 of the different transistors 320 of a given column 210-*i* that were shown in FIG. 4C are not in contact with one another in the IC device 400 of FIG. 4D, but, rather, are electrically connected to one another by electrically conductive portions 406 of a width 408, where the width 408 is smaller than the width 402. In order to not clutter the drawings, the portions 406 are only labeled for the column 210-2 in FIG. 4D, but analogous elements are illustrated in other columns 210 shown in FIG. 4D. In some embodiments, the portions 406 may include an electrically conductive material of substantially the same material composition as that of the portions 404. In other embodiments, material compositions of the materials of the portions 406 and the portions 404 of the bitlines 340 may be different.

Figure 5A:
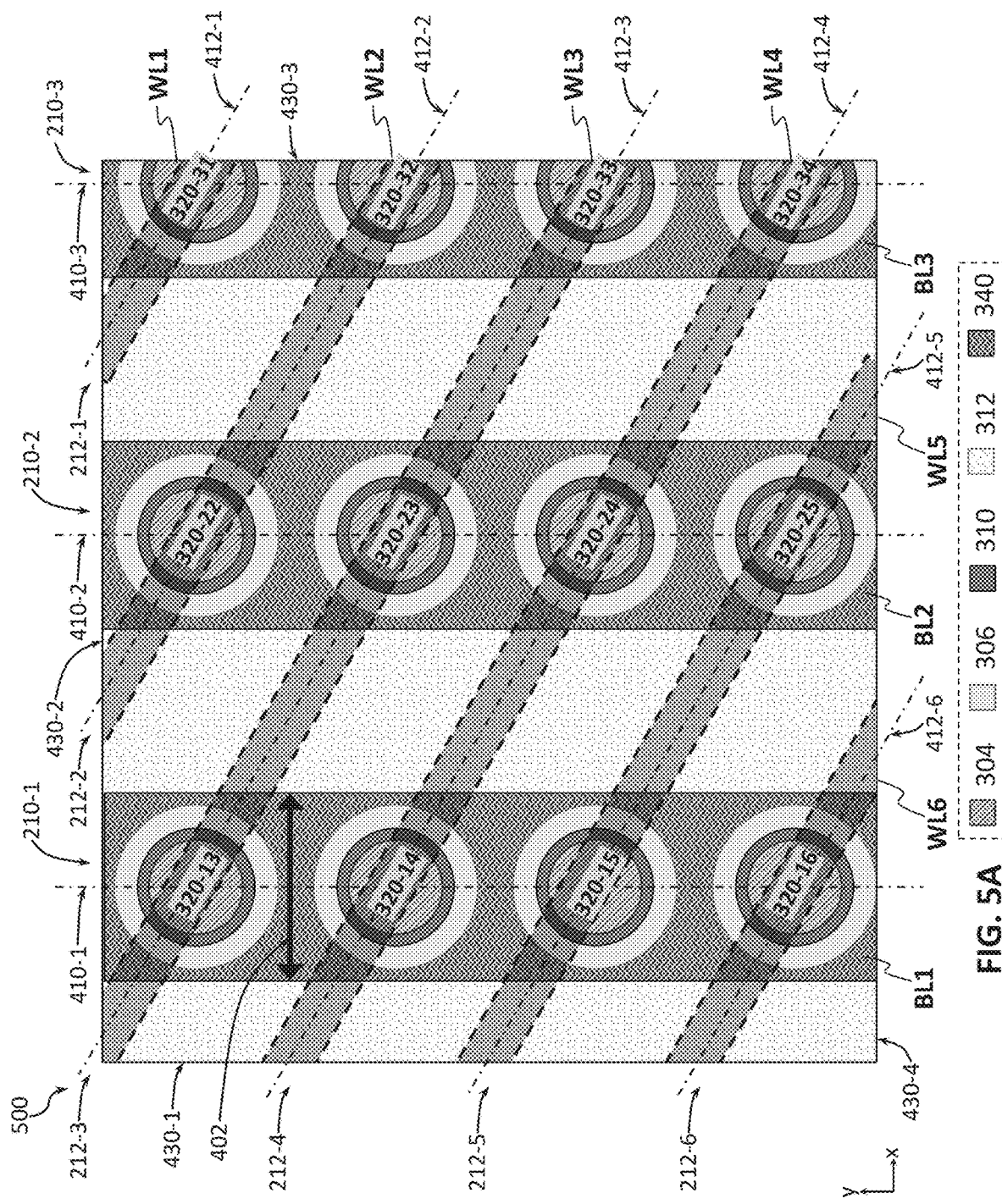
Figure 5C:
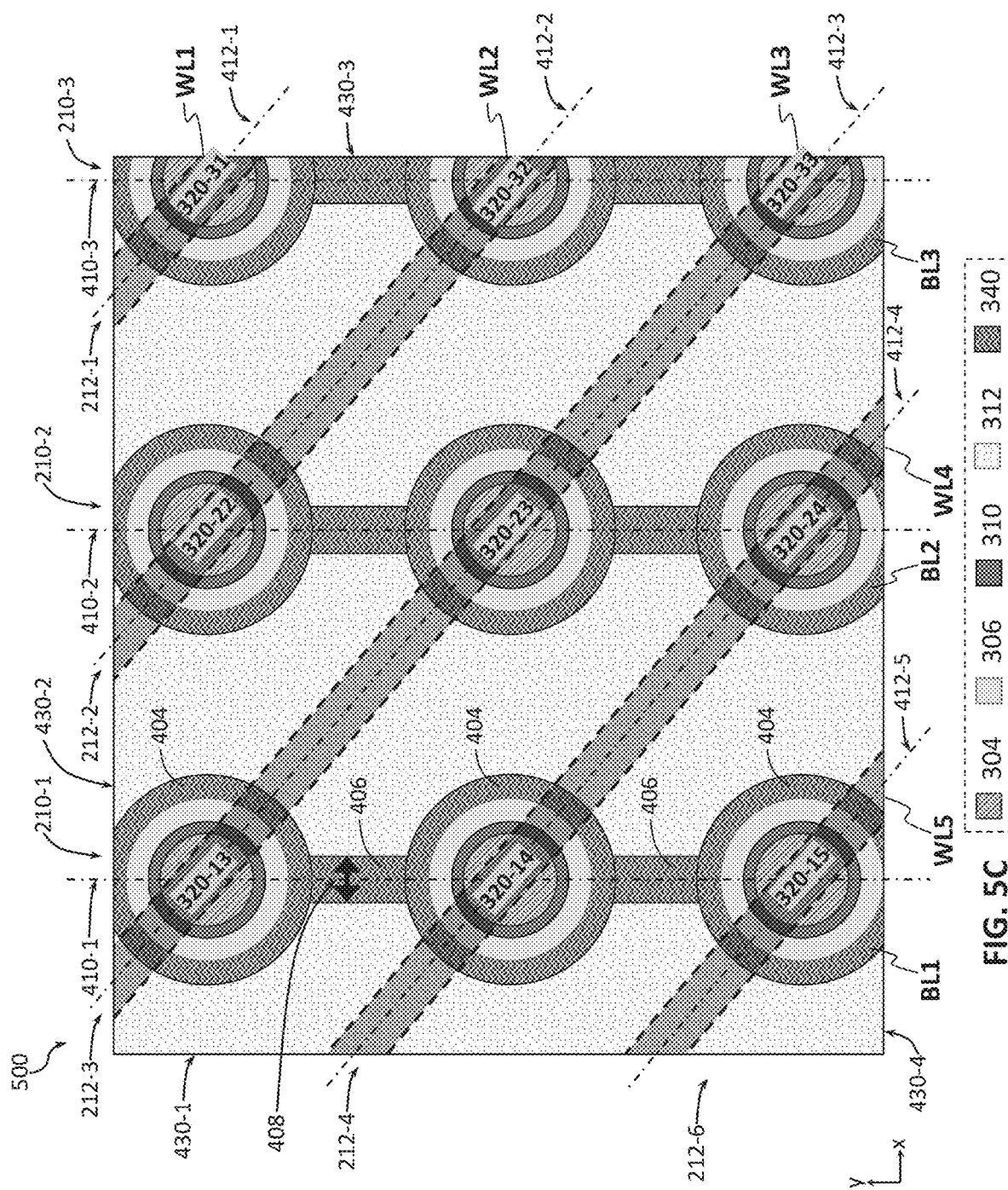

An implementation of an array of vertical transistors 320 that is alternative to that of the top-down views of FIGS. 4B-4D is shown in FIGS. 5A-5C, providing various views of an example IC device 500 implementing an array of a plurality of memory cells with the vertical transistors 320 and wrap-around bitlines 340 implemented as shown in FIG. 3, where the bitlines 340 are parallel to the edges 430-1, 430-3 of the support structure 302 but projections of the wordlines 350 onto the support structure 302 are not physically orthogonal to projections of the bitlines 340 onto the support structure 302 (as they were in the embodiments of FIGS. 4B-4D), according to some embodiments of the present disclosure. In particular, each of FIGS. 5A-5C illustrates a top-down view of the IC device 500 that is similar to that shown in FIGS. 4B-4D but showing alternative embodiments; the cross-sectional side view shown in FIG. 4A is also applicable for an analogous cross-section of the IC device 500 and, therefore, is not repeated as a part of FIG. 5. FIGS. 5A-5C use the same example coordinate system x-y-z that was used in FIGS. 3 and 4, meaning that each of FIGS. 5A-5C provides a top-down view across a plane x-y, with a number of components not shown in order to more readily illustrate how the bitlines 340 and the wordlines 350 of different transistors 320 of the IC device 500 may be arranged. FIG. 5 uses the same labeling for various elements as that shown in FIG. 4 and described above.

The view of FIG. 5A may be compared to that of FIG. 4B. The comparison reveals that, in the IC device 500, projections of the axes 410 and the axes 412 onto the plane of the support structure 302 are not perpendicular to one another (although different ones of the axes 410 may be substantially parallel to one another and different ones of the axes 412 may be substantially parallel to one another, as was the case in the IC device 400). Furthermore, the comparison reveals that, in the IC device 500, the axes 410 are substantially parallel to the edges 430-1 and 430-3. Because the axes 412 are not perpendicular to the axes 410, the axes 412 are not parallel to the edges 430-2 and 430-4. This is shown in FIGS. 5A-5C, illustrating that the smallest angle between a projection of any of the axes 412 onto a plane of the support structure 302 and a projection of any of the axes 410 onto the same plane may be between 5 and 85 degrees, including all values and ranges therein, e.g., between about 10 and 80 degrees or between about 15 and 35 degrees.

FIG. 5A illustrates an embodiment where each individual bitline 340 may extend, along a respective longitudinal axis 410-$i$, as an electrically continuous conductive structure of a substantially constant width 402 (a dimension labeled in FIG. 5A only for the BL1 in order to not clutter the drawing by providing the same labels for each of the BLs shown) to wrap around all of the second S/D regions 308-2 of the different transistors 320 of a given column 210-$i$ (e.g., of transistors 320-$i$1, 320-$i$2, 320-$i$3, and so on). On the other hand, FIG. 5B illustrates an embodiment alternative to FIG. 5A, where, similar to FIG. 5A, each individual bitline 340 still extends, along a respective longitudinal axis 410-$i$, as an electrically continuous conductive structure to wrap around all of the second S/D regions 308-2 of the different transistors 320 of a given column 210-$i$, but each individual bitline 340 includes portions 404 of the bitlines 340 that wrap around the second S/D regions 308-2 of the different transistors 320 of a given column 210-$i$ that are in conductive contact with one another. Thus, the view of FIG. 5B may be compared to that of FIG. 4C. In order to not clutter the drawings, the portions 404 are only labeled for the column 210-1 in FIG. 5B, but analogous elements are illustrated in other columns 210 shown in FIG. 5B. Similar to the IC device 400, in the IC device 500, in some embodiments, all of the portions 404 may include an electrically conductive material of substantially the same material composition; in other embodiments, material compositions of the materials of different ones of the portions 404 may be different. FIG. 5C illustrates another embodiment alternative to FIG. 5A and alternative to FIG. 5B, where, similar to FIG. 5A and FIG. 5B, each individual bitline 340 still extends, along a respective longitudinal axis 410-$i$, as an electrically continuous conductive structure to wrap around all of the second S/D regions 308-2 of the different transistors 320 of a given column 210-$i$, but the portions 404 of the bitlines 340 that wrap around the second S/D regions 308-2 of the different transistors 320 of a given column 210-$i$ that were shown in FIG. 5B to be in contact with one another are no longer in contact with one another in the IC device 500 of FIG. 5C, but, rather, are electrically connected to one another by electrically conductive portions 406 of a width 408, where the width 408 is smaller than the width 402. Thus, the view of FIG. 5C may be compared to that of FIG. 4D. In order to not clutter the drawings, the portions 406 are only labeled for the column 210-1 in FIG. 5C, but analogous elements are illustrated in other columns 210 shown in FIG. 5C. Similar to the IC device 400, in the IC device 500, in some embodiments, the portions 406 may include an electrically conductive material of substantially the same material composition as that of the portions 404; in other embodiments, material compositions of the materials of the portions 406 and the portions 404 of the bitlines 340 may be different.

Figure 6A:
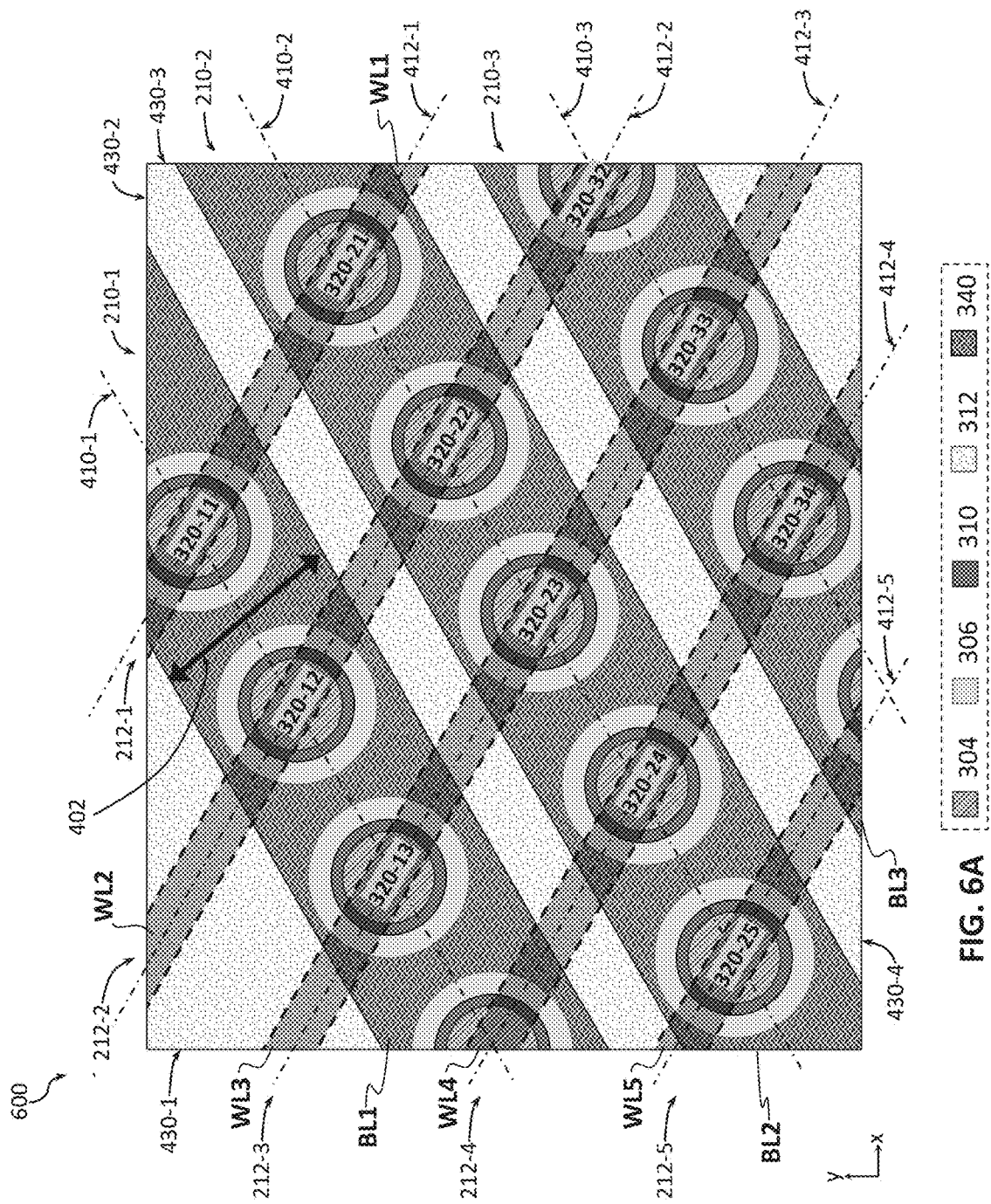
FIGS. 6A-6B provide various views of an example IC device implementing an array of a plurality of memory cells with the vertical transistors and wrap-around bitlines implemented as shown in FIG. 3, where bitlines and wordlines are physically not orthogonal to one another and not parallel to the edges of a support structure on which they are provided, according to some embodiments of the present disclosure.
Figure 6B:
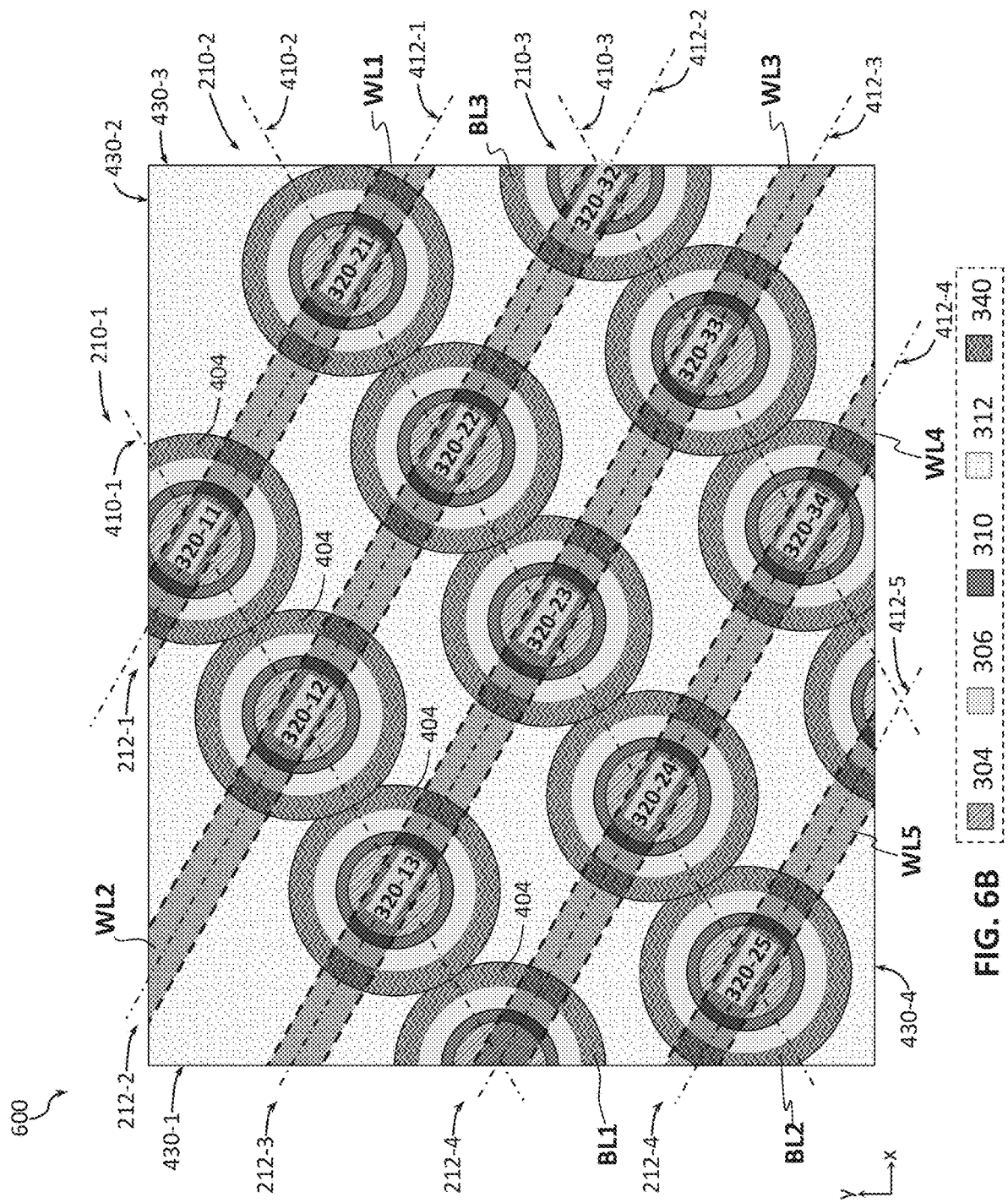

Another implementation of an array of vertical transistors 320 that is alternative to that of the top-down views of FIGS. 4B-4D is shown in FIGS. 6A-6B, providing various views of an example IC device 600 implementing an array of a plurality of memory cells with the vertical transistors 320 and wrap-around bitlines 340 implemented as shown in FIG. 3, where neither the bitlines 340 nor the wordlines 350 are parallel to any of the edges 430 of the support structure 302 (similar to the embodiments of FIGS. 4B-4D) and where projections of the wordlines 350 onto the support structure 302 are not physically orthogonal to projections of the bitlines 340 onto the support structure 302 (similar to the embodiments of FIGS. 5A-5C), according to some embodiments of the present disclosure. In particular, each of FIGS. 6A-6B illustrates a cross-section of the IC device 600 that is similar to that shown in FIGS. 4B-4D but showing alternative embodiments; the cross-sectional side view shown in FIG. 4A is also applicable for an analogous cross-section of the IC device 600 and, therefore, is not repeated as a part of FIG. 6. FIGS. 6A-6B use the same example coordinate system x-y-z that was used in FIGS. 3 and 4, meaning that each of FIGS. 6A-6B provides a top-down view across a plane x-y, with a number of components not shown in order to more readily illustrate how the bitlines 340 and the wordlines 350 of different transistors 320 of the IC device 600 may be arranged. FIG. 6 uses the same labeling for various elements as that shown in FIG. 4 and in FIG. 5 and described above.

The view of FIG. 6A may be compared to that of FIG. 4B. The comparison reveals that, in the IC device 600, projections of the axes 410 and the axes 412 onto the plane of the support structure 302 are not perpendicular to one another (although different ones of the axes 410 may be substantially parallel to one another and different ones of the axes 412 may be substantially parallel to one another, as was the case in the IC device 400). This is shown in FIGS. 6A-6B, illustrating that the smallest angle between a projection of any of the axes 412 onto a plane of the support structure 302 and a projection of any of the axes 410 onto the same plane may be between 5 and 85 degrees, including all values and ranges therein, e.g., between about 10 and 80 degrees or between about 15 and 35 degrees. Furthermore, the comparison reveals that, in the IC device 600, neither the axes 410 nor the axes 412 are parallel to any of the edges 430.

FIG. 6A illustrates an embodiment where each individual bitline 340 may extend, along a respective longitudinal axis 410-*i*, as an electrically continuous conductive structure of a substantially constant width 402 (a dimension labeled in FIG. 6A only for the BL1 in order to not clutter the drawing by providing the same labels for each of the BLs shown) to wrap around all of the second S/D regions 308-2 of the different transistors 320 of a given column 210-*i* (e.g., of transistors 320-*i*1, 320-*i*2, 320-*i*3, and so on). Thus, the view of FIG. 6A may further be compared to that of FIG. 5A. On the other hand, FIG. 6B illustrates an embodiment alternative to FIG. 6A, where, similar to FIG. 6A, each individual bitline 340 still extends, along a respective longitudinal axis 410-*i*, as an electrically continuous conductive structure to wrap around all of the second S/D regions 308-2 of the different transistors 320 of a given column 210-*i*, but each individual bitline 340 includes portions 404 of the bitlines 340 that wrap around the second S/D regions 308-2 of the different transistors 320 of a given column 210-*i* that are in conductive contact with one another. Thus, the view of FIG. 6B may be compared to that of FIG. 4C and to that of FIG. 5B. In order to not clutter the drawings, the portions 404 are only labeled for the column 210-1 in FIG. 6B, but analogous elements are illustrated in other columns 210 shown in FIG. 6B. Similar to the IC device 400, in the IC device 600, in some embodiments, all of the portions 404 may include an electrically conductive material of substantially the same material composition; in other embodiments, material compositions of the materials of different ones of the portions 404 may be different. Although not specifically shown in the present drawings, in further embodiments of the IC device 600 of FIG. 6B, the portions 404 that were shown in FIG. 6B to be in contact with one another may be not in contact with one another, but, rather, may be electrically connected to one another by electrically conductive portions 406 of a width 408, similar to how it was described for the IC devices of FIG. 4D and FIG. 5C.

Figure 7:
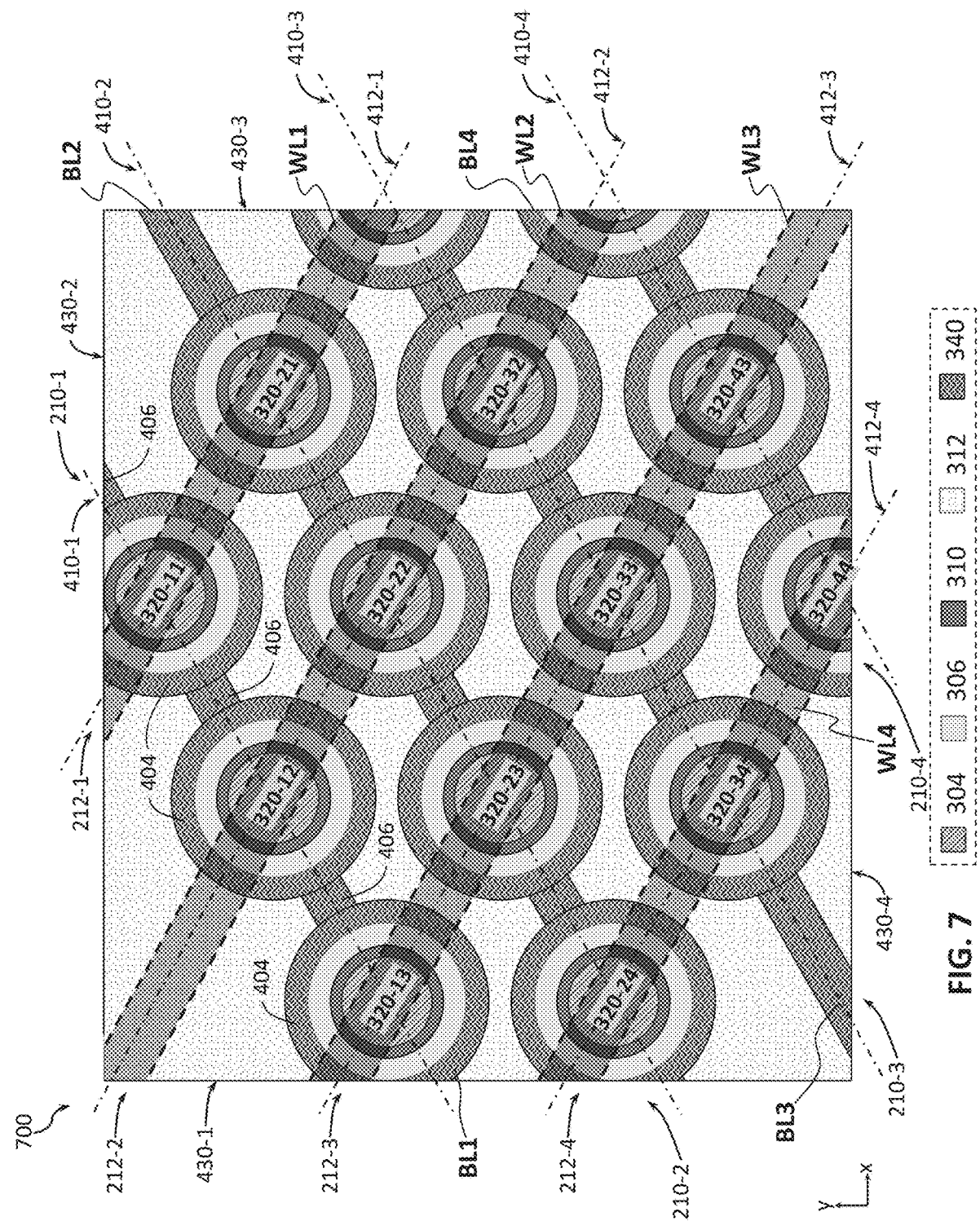
FIG. 7 provides a view of an example IC device implementing an array of a plurality of memory cells with the vertical transistors and wrap-around bitlines implemented as shown in FIG. 3, where some of the vertical transistors are arranged in a honeycomb arrangement, according to some embodiments of the present disclosure.

FIG. 7 provides a view of an example IC device 700 that is yet another alternative to the top-down views of FIGS. 4-6. The IC device 700 implements an array of a plurality of memory cells with the vertical transistors 320 and wrap-around bitlines 340 implemented as shown in FIG. 3, where some of the vertical transistors 320 are arranged in a honeycomb arrangement, according to some embodiments of the present disclosure. In particular, FIG. 7 illustrates a top-down view of the IC device 700 that is similar to that shown in FIGS. 4-6, but showing an alternative embodiments the cross-sectional side view shown in FIG. 4A is also applicable for an analogous cross-section of the IC device 700 and, therefore, is not repeated as a part of FIG. 7. FIG. 7 uses the same example coordinate system x-y-z that was used in FIGS. 3-6, providing a top-down view across a plane x-y, with a number of components not shown in order to more readily illustrate how the bitlines 340 and the wordlines 350 of different transistors 320 of the IC device 700 may be arranged. FIG. 7 uses the same labeling for various elements as that shown in FIGS. 3-6 and described above.

The IC device 700 is described to have a honeycomb arrangement because some of the vertical transistors 320, namely the transistors 320 that are not at the outer periphery of the array of the transistors 320 have six other transistors 320 as their equidistant nearest neighbors. For example, as shown in FIG. 7, for the transistor 320-23, the six nearest neighbors are transistors 320-13, 320-12, 320-22, 320-33, 320-34, and 320-24; for the transistor 320-33, the six nearest neighbors are transistors 320-23, 320-22, 320-32, 320-43, 320-44, and 320-34; for the transistor 320-22, the six nearest neighbors are transistors 320-12, 320-11, 320-21, 320-32, 320-33, and 320-23; and so on. In the IC device 700, the portions 404 and 406 (labeled only for the BL1 in order to not clutter the drawing) are implemented in accordance with the principles described above, e.g., those described with reference to FIG. 4D or FIG. 5C. Similar to the IC device 600, in the IC device 700, neither the bitlines 340 nor the wordlines 350 are parallel to any of the edges 430 of the support structure 302 (also similar to the embodiments of FIGS. 4B-4D) and projections of the wordlines 350 onto the support structure 302 are not physically orthogonal to projections of the bitlines 340 onto the support structure 302 (also similar to the embodiments of FIGS. 5A-5C).

The transistors 320 as described above, e.g., the transistors 320 of any embodiments of the IC devices 400, 500, 600, and 700, may be hysteretic memory cells on their own in some embodiments. In other embodiments, the transistors 320 may be non-hysteretic transistors (i.e., the gate insulator 310 may be a conventional gate dielectric material that does not have any hysteretic properties). In such embodiments, the transistors 320 as described herein may be coupled to capacitors which may be hysteretic capacitors.

One such example implementation is shown in FIGS. 8A-8B, providing various views of an example IC device 800 implementing a memory cell with a vertical transistor 320, a wrap-around bitline 340, and a capacitor 820, according to some embodiments of the present disclosure. The IC device 800 is similar to the IC device 300 in that it includes the vertical transistor 320 as described above. In particular, FIG. 8B illustrates a cross-section of the IC device 800 taken along the section/plane B-B of FIG. 8A, which is similar to the cross-section along the plane C-C of FIG. 3A, shown in FIG. 3C, while FIG. 8A illustrates a cross-section of the IC device 800 taken along the section/plane A-A of FIG. 3B, which is similar to the cross-section along the plane A-A of FIGS. 3B and 3C, shown in FIG. 3A. A cross-section similar to that shown in FIG. 3B is not shown in FIG. 8 because for the IC device 800 such a cross-section would look the same as that shown in FIG. 3B.

The differences between the IC device 800 and the IC device 300 arise in the presence of the capacitor 820 in the IC device 800, where a portion of the IC device 800 within a rectangular dotted contour shown in FIGS. 8A-8B indicates an approximate outline of the capacitor 820. As shown in FIGS. 8A-8B, the capacitor 820 includes a first capacitor electrode 822-1, a second capacitor electrode 822-2, and a capacitor insulator 824 between the first and second capacitor electrodes 822. More specifically, the first capacitor electrode 822-1 may be electrically coupled to (e.g., in conductive contact with) the first S/D region 308-1 at the bottom of the transistor 320. The plateline 360 may then be coupled to the second capacitor electrode 822-2, at the bottom of the second capacitor electrode 822-2, as shown in FIGS. 8A-8B.

In some embodiments, the capacitor 820 may be a three-dimensional metal-insulator-metal capacitor as shown in FIGS. 8A-8B, e.g., provided in an opening in the insulator material 312. In some embodiments, the first and second capacitor electrodes 822 may include any of the electrically conductive materials as described herein. In other embodiments, at least one of the first and second capacitor electrodes 822 may include any of the semiconductor materials as described herein. The capacitor insulator 824 may include the hysteretic element 135 as described above, instead of, or in addition to, a dielectric material as used in conventional, non-hysteretic, capacitors.

Figures 9A, 9B:
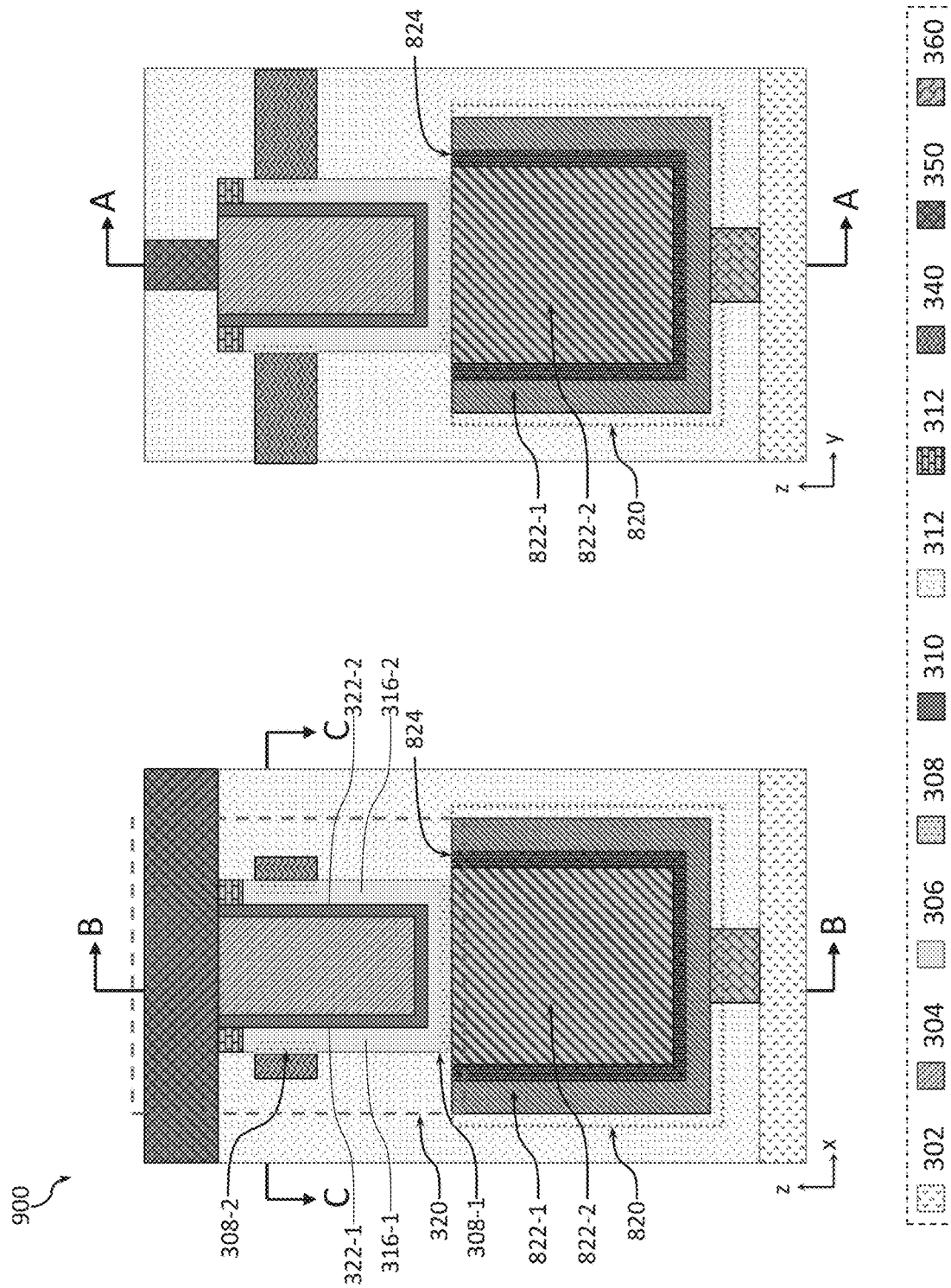
FIGS. 9A-9B provide various views of an example IC device implementing a memory cell with a vertical transistor, a wrap-around bitline, and a capacitor, according to other embodiments of the present disclosure.

Another example implementation where the transistors 320 as described herein is coupled to a capacitor that may be a hysteretic capacitor is shown in FIGS. 9A-9B, providing various views of an example IC device implementing a memory cell with a vertical transistor 320, a wrap-around bitline 340, and a capacitor 820, according to other embodiments of the present disclosure. The IC device 900 is similar to the IC device 800 in that it includes the vertical transistor 320 as described above and the vertical transistor 320 is coupled to a capacitor 820 that includes a first capacitor electrode 822-1, a second capacitor electrode 822-2, and a capacitor insulator 824 between the first and second capacitor electrodes 822. In particular, FIG. 9B illustrates a cross-section of the IC device 900 taken along the section/plane B-B of FIG. 9A, which is similar to the cross-section shown in FIG. 8B, while FIG. 9A illustrates a cross-section of the IC device 900 taken along the section/plane A-A of FIG. 3B, which is similar to the cross-section shown in FIG. 8A.

The differences between the IC device 900 and the IC device 800 is in the orientation of the capacitor 820. In particular, the capacitor 820 shown in FIGS. 9A-9B is substantially upside down compared to the capacitor 820 shown in FIGS. 8A-8B. As a result, in the IC device 900, it is the second capacitor electrode 822-2 that is electrically coupled to (e.g., in conductive contact with) the first S/D region 308-1 at the bottom of the transistor 320, while the plateline 360 may then be coupled to the first capacitor electrode 822-1, at the bottom of the first capacitor electrode 822-1, as shown in FIGS. 9A-9B.

While FIGS. 8A-8B and FIGS. 9A-9B are described with reference to the capacitors 820 being hysteretic capacitors, in other embodiments, the capacitor 820 of the IC devices 800 or 900 may be a non-hysteretic capacitor, while the transistor 320 of these IC devices may be a hysteretic transistor, all of which embodiments being within the scope of the present disclosure.

Various arrangements of the IC devices 300, 400, 500, 600, 700, 800, and 900 as illustrated in FIGS. 3-9 do not represent an exhaustive set of IC devices implementing diagonal memory with vertical transistors and wrap-around control lines as described herein, but merely provide examples of such devices/structures/assemblies. In various embodiments, any of the features described with reference to one of the IC devices 300, 400, 500, 600, 700, 800, and 900 may be combined with any of the features described with reference to another one of the IC devices 300, 400, 500, 600, 700, 800, and 900. For example, in some embodiments, any embodiments of the IC devices 400, 500, 600, or 700 may further include the capacitors 820 as described with reference to FIG. 8 or FIG. 9, where different instances of such capacitors 820 may be coupled to any (e.g., all or some) of the transistors 320 of the IC devices 400, 500, 600, or 700.

In another example, while the illustrations of FIGS. 3-9 show the bitlines 340 being the control lines that wrap around the upper portions (e.g., the second S/D regions 308-2) of the transistors 320, while showing the platelines 360 being the control lines coupled to the bottoms (e.g., the first S/D regions 308-1) of the transistors 320, in other embodiments, this designation of the control lines may be reversed. In general, the number and positions of various elements shown in FIGS. 3-9 is purely illustrative and, in various other embodiments, other numbers of these elements, provided in other locations relative to one another may be used in accordance with the general architecture considerations described herein.

Arrangements with one or more IC devices implementing diagonal memory with vertical transistors and wrap-around control lines as disclosed herein may be included in any suitable electronic device. FIGS. 10-13 illustrate various examples of devices and components that may include one or more IC devices implementing diagonal memory with vertical transistors and wrap-around control lines as disclosed herein.

Figure 10:
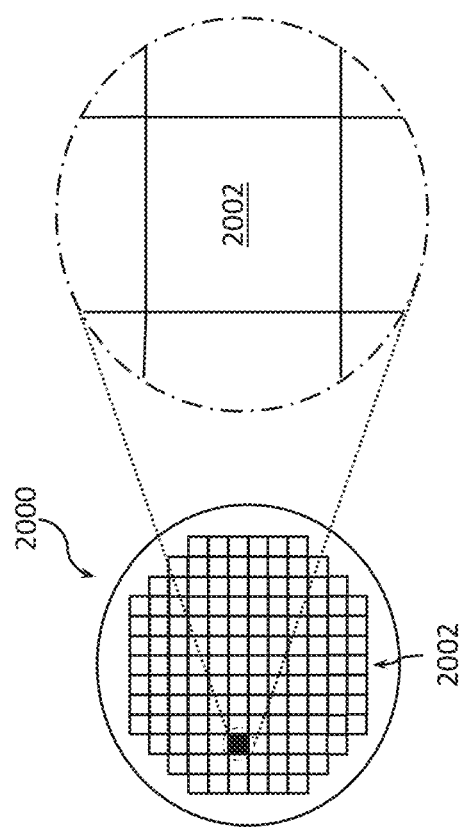
FIG. 10 provides top views of a wafer and dies that may include one or more IC devices implementing diagonal memory with vertical transistors and wrap-around control lines in accordance with any of the embodiments disclosed herein.

FIG. 10 illustrates top views of a wafer 2000 and dies 2002 that may include one or more IC devices implementing diagonal memory with vertical transistors and wrap-around control lines in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 11. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more IC devices implementing diagonal memory with vertical transistors and wrap-around control lines as described herein). After the fabrication of the semiconductor product is complete (e.g., after manufacture of any embodiment of the IC devices implementing diagonal memory with vertical transistors and wrap-around control lines as described herein), the wafer 2000 may undergo a singulation process in which each of the dies 2002 is separated from one another to provide discrete "chips" of the semiconductor product. In particular, devices that include one or more IC devices implementing diagonal memory with vertical transistors and wrap-around control lines as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 13) or other logic that is configured to store information in the memory devices or execute instructions stored in the memory array.

Figure 11:
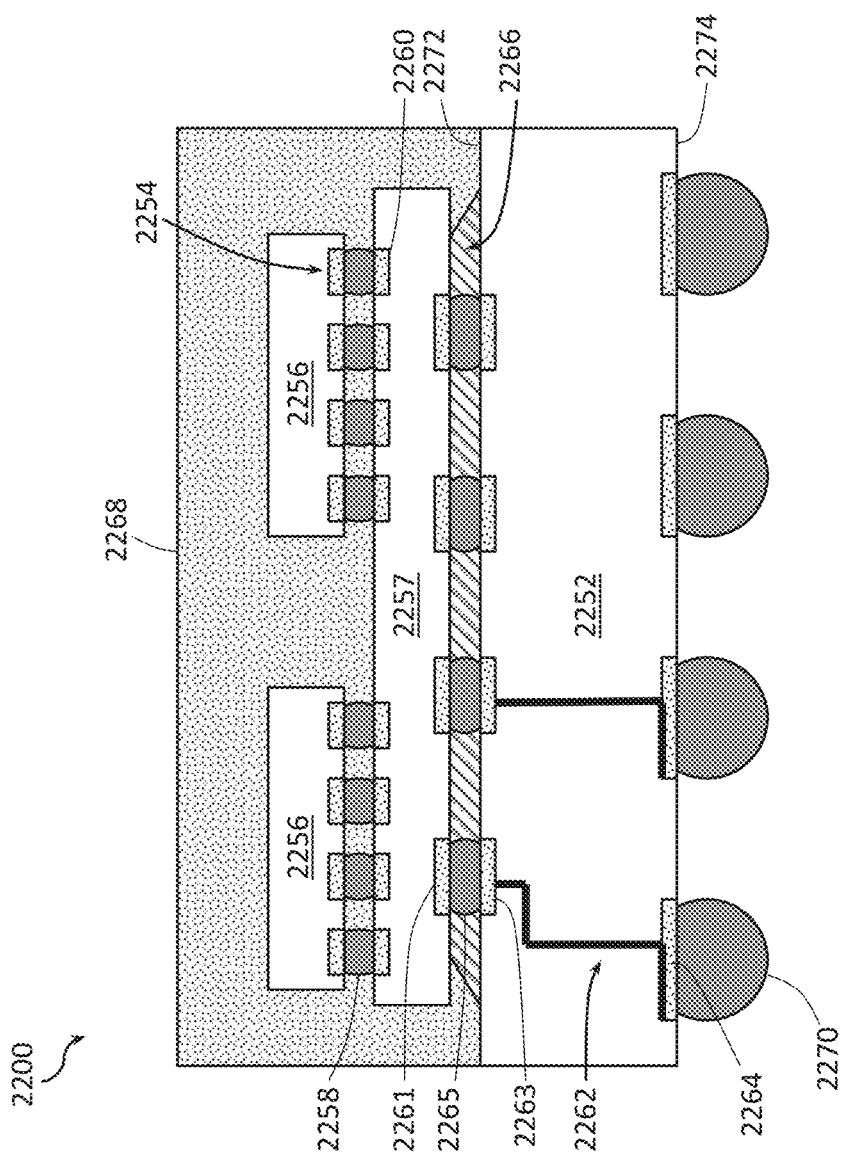
FIG. 11 is a cross-sectional side view of an IC package that may include one or more IC devices implementing diagonal memory with vertical transistors and wrap-around control lines in accordance with any of the embodiments disclosed herein.

FIG. 11 is a side, cross-sectional view of an example IC package 2200 that may include one or more IC devices implementing diagonal memory with vertical transistors and wrap-around control lines in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 11 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

The dies 2256 may take the form of any of the embodiments of the die 2002 discussed herein (e.g., may include any of the embodiments of the IC devices implementing diagonal memory with vertical transistors and wrap-around control lines as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more IC devices implementing diagonal memory with vertical transistors and wrap-around control lines, e.g., as discussed above; in some embodiments, at least some of the dies 2256 may not include any IC devices implementing diagonal memory with vertical transistors and wrap-around control lines.

The IC package 2200 illustrated in FIG. 11 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 12:
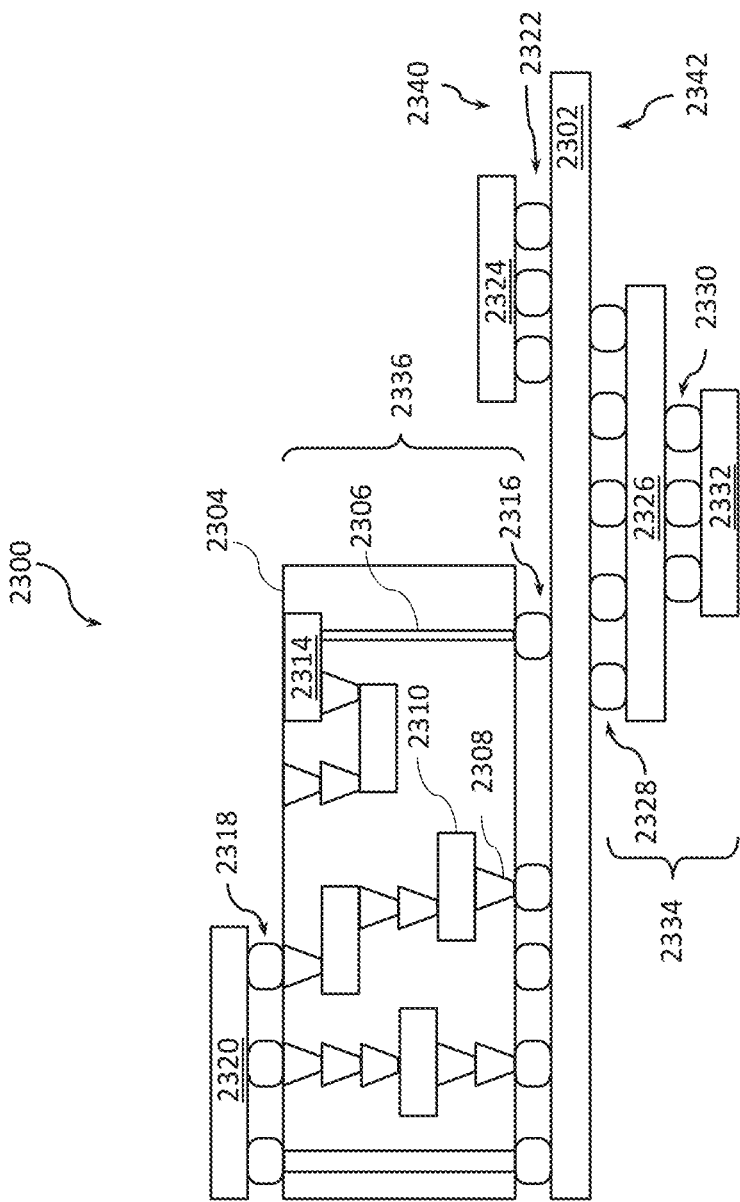
FIG. 12 is a cross-sectional side view of an IC device assembly that may include one or more IC devices implementing diagonal memory with vertical transistors and wrap-around control lines in accordance with any of the embodiments disclosed herein.

FIG. 12 is a cross-sectional side view of an IC device assembly 2300 that may include components having one or more IC devices implementing diagonal memory with vertical transistors and wrap-around control lines in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices implementing diagonal memory with vertical transistors and wrap-around control lines in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more IC devices implementing diagonal memory with vertical transistors and wrap-around control lines provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 10), an IC device, or any other suitable component. In particular, the IC package 2320 may include one or more IC devices implementing diagonal memory with vertical transistors and wrap-around control lines as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 13:
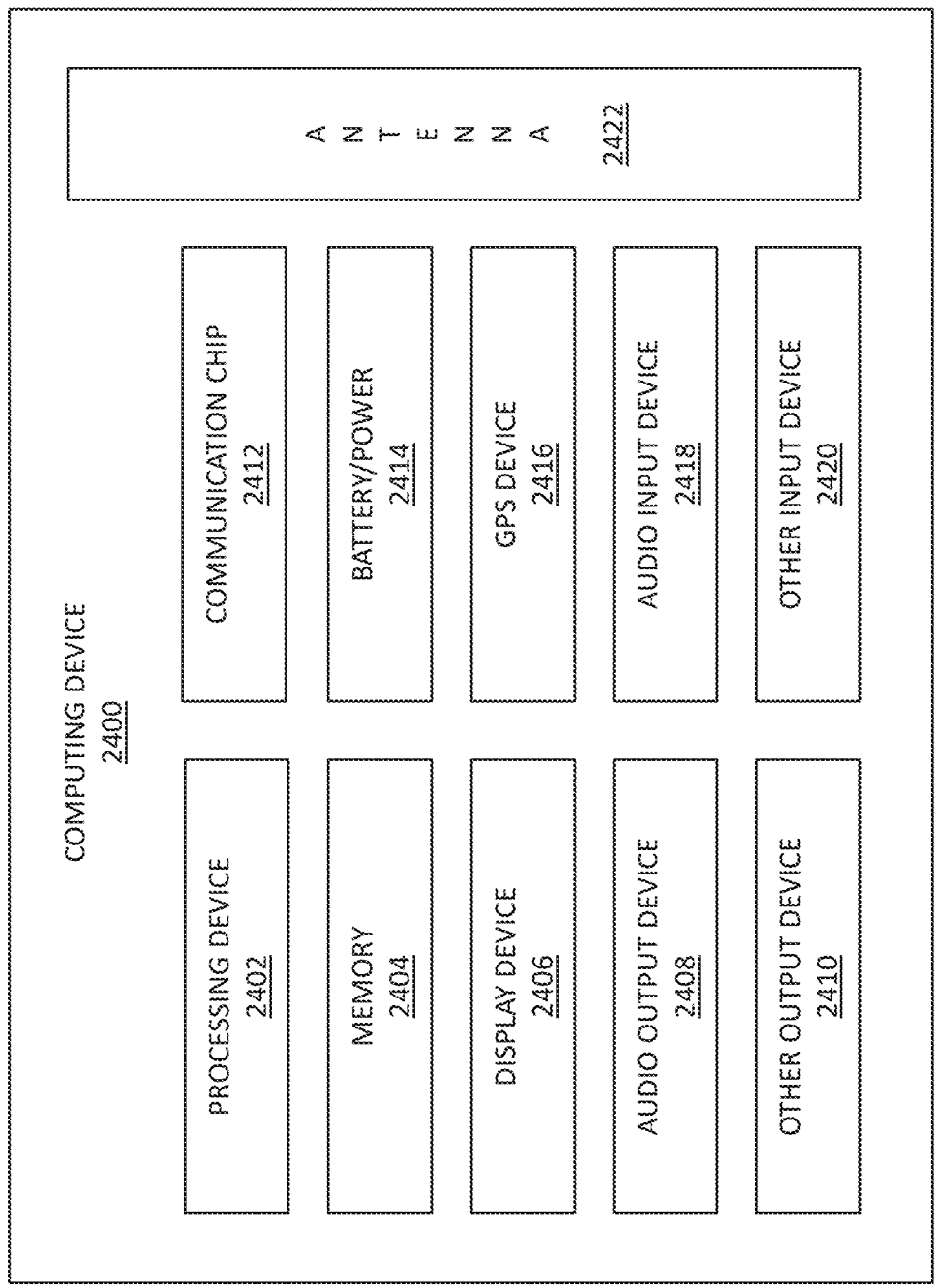
FIG. 13 is a block diagram of an example computing device that may include one or more IC devices implementing diagonal memory with vertical transistors and wrap-around control lines in accordance with any of the embodiments disclosed herein.

FIG. 13 is a block diagram of an example computing device 2400 that may include one or more components with one or more IC devices implementing diagonal memory with vertical transistors and wrap-around control lines in accordance with any of the embodiments disclosed herein. For example, any suitable ones of the components of the computing device 2400 may include a die (e.g., the die 2002 (FIG. 10)) including one or more IC devices implementing diagonal memory with vertical transistors and wrap-around control lines in accordance with any of the embodiments disclosed herein. Any of the components of the computing device 2400 may include an IC package 2200 (FIG. 11). Any of the components of the computing device 2400 may include an IC device assembly 2300 (FIG. 12).

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded hysteretic memory, e.g., one or more IC devices implementing diagonal memory with vertical transistors and wrap-around control lines as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example A1 provides an IC device that includes a support structure (302, e.g., a substrate, a die, a wafer, etc.), an insulator material (312) provided over the support structure, and a memory cell provided in an opening in the insulator material, where each of a sidewall of the opening and a bottom of the opening are lined with a stack of a channel material (306) and a gate insulator material, the opening is at least partially filled with a gate electrode material (304), and the gate insulator material is between the channel material and the gate electrode material. The IC device further includes a first control line for the memory cell (e.g., a wordline 350), electrically coupled to (e.g., in conductive contact with) the gate electrode material; and a second control line for the memory cell (e.g., a bitline 340), wrapping around at least portion of the sidewall of the opening to electrically couple to (e.g., be in conductive contact with) the channel material at the sidewall of the opening.

Example A2 provides the IC device according to example A1, where the gate insulator material includes a hysteretic element.

Example A3 provides the IC device according to example A2, where the hysteretic element includes a ferroelectric material or an antiferroelectric material.

Example A4 provides the IC device according to example A3, where the ferroelectric or the antiferroelectric material includes a material at least 5% of which is in an orthorhombic phase and/or a tetragonal phase, the material including one or more of a material including hafnium, zirconium, and oxygen; a material including silicon, hafnium, and oxygen; a material including germanium, hafnium, and oxygen; a material including aluminum, hafnium, and oxygen; a material including yttrium, hafnium, and oxygen; a material including lanthanum, hafnium, and oxygen; a material including gadolinium, hafnium, and oxygen; and a material including niobium, hafnium, and oxygen.

Example A5 provides the IC device according to example A2, where the hysteretic element includes a stack of a material that includes silicon and oxygen (e.g., silicon oxide) and a material that includes silicon and nitrogen (e.g., silicon nitride).

Example A6 provides the IC device according to any one of examples A1-5, further including a third control line for the memory cell (e.g., a plateline 360), electrically coupled to (e.g., in conductive contact with) the channel material at the bottom of the opening.

Example A7 provides the IC device according to example A6, where the first control line is a wordline, the second control line is a bitline, and the third control line is a plateline, or the first control line is a wordline, the second control line is a plateline, and the third control line is a bitline.

Example A8 provides the IC device according to any one of examples A6-7, where a dopant concentration of at least a portion of the channel material that is in contact with the third control line is greater than a dopant concentration of a portion of the channel material that is not in contact with the third control line. In this manner, a contact between the third control line (which typically includes a metal) and the channel material (which is a semiconductor material) may advantageously be an Ohmic contact.

Example A9 provides the IC device according to any one of the preceding examples A, where a dopant concentration of at least a portion of the channel material that is in contact with the second control line is greater than a dopant concentration of at least a portion of a channel material that is not in contact with the second control line. In this manner, a contact between the second control line (which typically includes a metal) and the channel material (which is a semiconductor material) may advantageously be an Ohmic contact.

Example A10 provides the IC device according to any one of examples A1-5, where the memory cell further includes a capacitor, the capacitor including a first capacitor electrode, a second capacitor electrode, and a capacitor insulator between the first capacitor electrode and the second capacitor electrode, and the first capacitor electrode is electrically coupled to (e.g., in conductive contact with) the channel material at the bottom of the opening.

Example A11 provides the IC device according to example A10, further including a third control line for the memory cell (e.g., a capacitor plateline), electrically coupled to (e.g., in conductive contact with) the second capacitor electrode.

Example A12 provides the IC device according to any one of examples A10-11, where the capacitor insulator material includes a hysteretic element.

Example A13 provides the IC device according to example A12, where the hysteretic element includes a ferroelectric material or an antiferroelectric material.

Example A14 provides the IC device according to example A13, where the ferroelectric or the antiferroelectric material includes a material at least 5% of which is in an orthorhombic phase and/or a tetragonal phase, the material including one or more of a material including hafnium, zirconium, and oxygen; a material including silicon, hafnium, and oxygen; a material including germanium, hafnium, and oxygen; a material including aluminum, hafnium, and oxygen; a material including yttrium, hafnium, and oxygen; a material including lanthanum, hafnium, and oxygen; a material including gadolinium, hafnium, and oxygen; and a material including niobium, hafnium, and oxygen.

Example A15 provides the IC device according to example A12, where the hysteretic element includes a stack of a material that includes silicon and oxygen (e.g., silicon oxide) and a material that includes silicon and nitrogen (e.g., silicon nitride).

Example A16 provides the IC device according to any one of the preceding examples A, where the memory cell is a first memory cell of a plurality of substantially identical memory cells arranged in rows and columns, the first memory cell is a memory cell of a first subset of the memory cells of the plurality, where the first subset of the memory cells is arranged in a first row of the rows, the first memory cell is a memory cell of a second subset of the memory cells of the plurality, where the second subset of the memory cells is arranged in a first column of the columns and where the only memory cell that is common to the first and second subsets is the first memory cell, the first control line is electrically coupled to the gate electrode material of each memory cell of the first subset of the memory cells, the second control line is electrically coupled to the gate electrode material of each memory cell of the second subset of the memory cells, and a projection of the first control line onto a plane parallel to the support structure is perpendicular to a projection of the second control line onto the plane.

Example A17 provides the IC device according to example A16, where the plurality of memory cells further includes a third subset of the memory cells, where the third subset of the memory cells is arranged in a second column of the columns, the third subset of the memory cells includes a second memory cell, where the second memory cell is also a memory cell of the first subset but not a memory cell of the second subset, and where the only memory cell that is common to the first and third subsets is the second memory cell and the second and third subsets do not have any memory cells in common, a further second control line (e.g., a second bitline) is electrically coupled to the gate electrode material of each memory cell of the third subset of the memory cells, and the projection of the first control line onto the plane is perpendicular to a projection of the further second control line onto the plane.

Example A18 provides the IC device according to example A17, where the memory cells of the second subset are arranged along a first line parallel to the support structure, the memory cells of the third subset are arranged along a second line parallel to the support structure, the plurality of memory cells further includes a fourth subset of the memory cells, where the fourth subset of the memory cells is arranged along a third line parallel to the support structure, the third line is between and substantially parallel to the first line and the second line, and the memory cells of the fourth subset are staggered with respect to the memory cells of the second subset and with respect to the memory cells of the third subset.

Example A19 provides an IC device that includes a support structure (302, e.g., a substrate, a die, a wafer, etc.); an insulator material (312) provided over the support structure; and a plurality of memory cells provided in respective openings in the insulator material, where, for an individual memory cell of the plurality of memory cells, each of a sidewall of the opening and a bottom of the opening are lined with a stack of a channel material (306) and a gate insulator material, the opening is at least partially filled with a gate electrode material (304), and the gate insulator material is between the channel material and the gate electrode material. The IC device further includes a first control line (e.g., a wordline 350), electrically coupled to (e.g., in conductive contact with) the gate electrode material of a first subset of the plurality of memory cells; and a second control line (e.g., a bitline 340), wrapping around at least a portion of the sidewall of the opening of a second subset of the plurality of memory cells, to electrically couple to (e.g., be in conductive contact with) the channel material at the sidewall of the opening of each memory cell of the second subset, where the first subset and the second subset have, at most, one memory cell in common, and a projection of the first control line onto a plane parallel to the support structure is perpendicular to a projection of the second control line onto the plane.

Example A20 provides the IC device according to example A19, where the second control line further wraps around at least a portion of the sidewall of the opening of a third subset of the plurality of memory cells, to electrically couple to (e.g., be in conductive contact with) the channel material at the sidewall of the opening of each memory cell of the third subset, the third subset does not have any memory cells in common with the first subset and with the second subset, and memory cells of the third subset are staggered with respect to memory cells of the second subset.

Example A21 provides the IC device according to examples 19 or 20, where an individual memory cell of the plurality of memory cells is the memory cell of the IC device according to any one of examples A1-18.

Example A22 provides an IC device that includes a support structure (302, e.g., a substrate, a die, a wafer, etc.); a memory cell provided over the support structure, the memory cell including a vertical transistor; a first control line for the memory cell (e.g., a wordline 350), electrically coupled to (e.g., in conductive contact with) a gate electrode material of the vertical transistor; and a second control line for the memory cell (e.g., a bitline 340), electrically coupled to (e.g., in conductive contact with) a portion of a channel material of the vertical transistor, where a gate insulator of the vertical transistor includes a material at least 5% of which is in an orthorhombic phase and/or a tetragonal phase, the material including one or more of a material including hafnium, zirconium, and oxygen; a material including silicon, hafnium, and oxygen; a material including germanium, hafnium, and oxygen; a material including aluminum, hafnium, and oxygen; a material including yttrium, hafnium, and oxygen; a material including lanthanum, hafnium, and oxygen; a material including gadolinium, hafnium, and oxygen; and a material including niobium, hafnium, and oxygen.

Example A23 provides the IC device according to example A22, where the second control line wraps around the portion of the channel material of the vertical transistor.

Example A24 provides the IC device according to example A23, where the portion of the channel material is a first portion, the IC device further includes a third control line for the memory cell (e.g., a plateline 360), electrically coupled to (e.g., in conductive contact with) a second portion of the channel material of the vertical transistor, the second portion of the channel material is closer to the support structure than the first portion of the channel material, and the first portion of the channel material is closer to the support structure than the first control line.

Example A25 provides the IC device according to example A24, where each of the first control line, the second control line, and the third control line includes at least one electrically conductive material.

Example B1 provides an IC device that includes a support structure (302, e.g., a substrate, a die, a wafer, etc.); a plurality of vertical transistors provided over the support structure; a first control line (e.g., a wordline 350), electrically continuous along a first longitudinal axis (e.g., an axis 412-j) and electrically coupled to (e.g., in conductive contact with) gates of a first subset of the plurality of vertical transistors; and a second control line (e.g., a bitline 340), electrically continuous along a second longitudinal axis (e.g., an axis 410-i) and wrapping around at least portions of channel materials of a second subset of the plurality of vertical transistors, where the first subset and the second subset have in common one vertical transistor of the plurality of vertical transistors, and at least one of the first longitudinal axis and the second longitudinal axis is not parallel to any edges (borders) of the support structure.

Example B2 provides the IC device according to example B1, where the first longitudinal axis is not parallel to any of the edges of the support structure, the second longitudinal axis is substantially parallel to an edge of the edges of the support structure, and, optionally, vertical transistors of the second subset are arranged along a line parallel to the edge.

Example B3 provides the IC device according to example B1, where the first longitudinal axis is not parallel to any of the edges of the support structure, and the second longitudinal axis is not parallel to any of the edges of the support structure.

Example B4 provides the IC device according to example B3, where vertical transistors of the first subset are arranged along a first line, vertical transistors of the second subset are arranged along a second line, the first line is not parallel to any of the edges of the support structure, and the second line is not parallel to any of the edges of the support structure.

Example B5 provides the IC device according to examples B3 or B4, where the first longitudinal axis is substantially perpendicular to the second longitudinal axis.

Example B6 provides the IC device according to any one of examples B1-4, where a smallest angle between a projection of the first longitudinal axis onto a plane of the support structure and a projection of the second longitudinal axis onto the plane is between 5 and 85 degrees, including all values and ranges therein, e.g., between about 10 and 80 degrees or between about 15 and 35 degrees.

Example B7 provides the IC device according to example B6, where the one vertical transistor that is in common between the first subset and the second subset has six other vertical transistors of the plurality of vertical transistors to which the one vertical transistor is equidistant (i.e., the vertical transistor that is coupled to both the first control line and the second control line has six nearest neighbors of other vertical transistors).

Example B8 provides the IC device according to example B7, where a first pair of the six other vertical transistors are in the first subset, and a second pair of the of the six other vertical transistors, different from the first pair, are in the second subset.

Example B9 provides the IC device according to examples B7 or B8, where the six other vertical transistors are arranged in a honeycomb pattern around the one vertical transistor.

Example B10 provides the IC device according to any one of the preceding examples B, where a gate insulator of an individual vertical transistor of the plurality of vertical transistors includes a hysteretic element.

Example B11 provides the IC device according to any one of the preceding examples B, where an individual vertical transistor of the plurality of vertical transistors is electrically coupled to (e.g., in conductive contact with) a capacitor, and a capacitor insulator of the capacitor includes a hysteretic element.

Example B12 provides the IC device according to examples B10 or B11, where the hysteretic element includes a ferroelectric material or an antiferroelectric material.

Example B13 provides the IC device according to example B12, where the ferroelectric or the antiferroelectric material includes a material at least 5% of which is in an orthorhombic phase and/or a tetragonal phase, the material including one or more of a material including hafnium, zirconium, and oxygen; a material including silicon, hafnium, and oxygen; a material including germanium, hafnium, and oxygen; a material including aluminum, hafnium, and oxygen; a material including yttrium, hafnium, and oxygen; a material including lanthanum, hafnium, and oxygen; a material including gadolinium, hafnium, and oxygen; and a material including niobium, hafnium, and oxygen.

Example B14 provides the IC device according to examples B10 or B11, where the hysteretic element includes a stack of a material that includes silicon and oxygen (e.g., silicon oxide) and a material that includes silicon and nitrogen (e.g., silicon nitride).

Example B15 provides the IC device according to any one of the preceding examples B, where the IC device further includes an insulator material (312) provided over the support structure, an individual vertical transistor of the plurality of vertical transistors is provided in an opening in the insulator material, a channel material of the individual vertical transistor is at a sidewall of the opening, and a gate electrode material of a gate of the individual vertical transistor is within the opening so that the channel material is between the insulator material and the gate electrode material.

Example B16 provides the IC device according to example B15, where a gate dielectric material of the gate of the individual vertical transistor is within the opening so that the gate dielectric material is between the channel material and the gate electrode material.

Example B17 provides the IC device according to examples B15 or B16, where the channel material of the individual vertical transistor is further at a bottom of the opening, and a third control line (e.g., a plateline 360) is electrically coupled to (e.g., in conductive contact with) a portion of the channel material of the individual vertical transistor at the bottom of the opening.

Example B18 provides the IC device according to example B17, where the individual vertical transistor is one of vertical transistors of the second subset other than the one vertical transistor that is in common between the first subset and the second subset, the portions of the channel materials of the second subset around which the second control line wraps around are first portions of the channel materials of the second subset, and the third control line is electrically continuous along a third axis and is electrically coupled to second portions of the channel materials of the second subset.

Example B19 provides the IC device according to example B18, where a projection of the second longitudinal axis onto a plane of the support structure and a projection of the third axis onto the plane are substantially parallel.

Example B20 provides the IC device according to example B17, where the individual vertical transistor is one of vertical transistors of the first subset other than the one vertical transistor that is in common between the first subset and the second subset, and the third control line is electrically continuous along a third axis and is electrically coupled to portions of channel materials of the first subset.

Example B21 provides the IC device according to example B20, where a projection of the first longitudinal axis onto a plane of the support structure and a projection of the third axis onto the plane are substantially parallel.

Example B22 provides an IC device that includes a support structure (302, e.g., a substrate, a die, a wafer, etc.); an insulator material (312) provided over the support structure; and a plurality of memory cells provided in respective openings in the insulator material, where, for an individual memory cell of the plurality of memory cells, each of a sidewall of the opening and a bottom of the opening are lined with a stack of a channel material (306) and a gate insulator material, the opening is at least partially filled with a gate electrode material (304), and the gate insulator material is between the channel material and the gate electrode material. The IC device further includes a first control line (e.g., a wordline 350), electrically coupled to (e.g., in conductive contact with) the gate electrode material of a first subset of the plurality of memory cells; and a second control line (e.g., a bitline 340), wrapping around at least a portion of the sidewall of the opening of a second subset of the plurality of memory cells, to electrically couple to (e.g., be in conductive contact with) the channel material at the sidewall of the opening of each memory cell of the second subset, where the first subset and the second subset have, at most, one memory cell in common, and a smallest angle between a projection of the first control line onto a plane parallel to the support structure and a projection of the second control line onto the plane is between 5 and 85 degrees, including all values and ranges therein, e.g., between about 10 and 80 degrees or between about 15 and 35 degrees.

Example B23 provides the IC device according to example B22, where the individual memory cell further includes a capacitor having a capacitor electrode that is electrically coupled to (e.g., in conductive contact with) a portion of the channel material at the bottom of the opening.

In various further examples B, the IC device according to any one of examples B22-23 may be the IC device according to any one of the preceding examples A or B, e.g., any one of the examples B1-21, or may include components of the IC device according to any one of the preceding examples A or B.

Example B24 provides an IC device that includes a support structure (302, e.g., a substrate, a die, a wafer, etc.);

an insulator material (312) provided over the support structure; and a plurality of transistors provided in respective openings in the insulator material, where, for an individual transistor of the plurality of transistors, a channel material (e.g., the channel material 306) is at a sidewall of the opening and a bottom of the opening, and a gate electrode material (304) at least partially fills the opening so that the channel material is between the insulator material and the gate electrode material. The IC device further includes a first control line (e.g., a wordline 350), electrically coupled to (e.g., in conductive contact with) the gate electrode material of each transistor of a first subset of the plurality of transistors; a second control line (e.g., a bitline 340), wrapping around at least a portion of the channel material at the sidewall of the opening of each transistor of a second subset of the plurality of transistors, to electrically couple to (e.g., be in conductive contact with) the channel material at the sidewall of the opening of each transistor of the second subset; and a third control line (e.g., a plateline 360), electrically coupled to (e.g., in conductive contact with) at least a portion of the channel material at the bottom of the opening of either the each transistor of the first subset of the plurality of transistors or the each transistor of the second subset of the plurality of transistors.

Example B25 provides the IC device according to example B24, where the first subset and the second subset have in common transistor of the plurality of transistors, and at least one of the first control line and the second control line is not parallel to any edges (borders) of the support structure.

In various further examples B, the IC device according to any one of examples B24-25 may be the IC device according to any one of the preceding examples A or B, e.g., any one of the examples B1-21, or may include components of the IC device according to any one of the preceding examples A or B.

Example C1 provides an IC package that includes an IC device according to any one of the preceding examples A or B; and a further IC component, coupled to the IC device.

Example C2 provides the IC package according to example C1, where the further component includes one of a package substrate and an interposer.

Example C3 provides the IC package according to example C1, where the further component is a further IC die.

Example C4 provides the IC package according to any one of examples C1-3, where the IC device includes, or is a part of, at least one of a memory device, a computing device, a wearable device, a handheld electronic device, and a wireless communications device.

Example C5 provides an electronic device that includes a carrier substrate; and one or more of the IC device according to any one of the preceding examples and the IC package according to any one of the preceding examples, coupled to the carrier substrate.

Example C6 provides the electronic device according to example C5, where the carrier substrate is a motherboard.

Example C7 provides the electronic device according to example C5, where the carrier substrate is a PCB.

Example C8 provides the electronic device according to any one of examples C5-7, where the electronic device is a wearable electronic device (e.g., a smart watch) or handheld electronic device (e.g., a mobile phone).

Example C9 provides the electronic device according to any one of examples C5-8, where the electronic device further includes one or more communication chips and an antenna.

Example C10 provides the electronic device according to any one of examples C5-9, where the electronic device is an RF transceiver.

Example C11 provides the electronic device according to any one of examples C5-9, where the electronic device is one of a switch, a power amplifier, a low-noise amplifier, a filter, a filter bank, a duplexer, an upconverter, or a downconverter of an RF communications device, e.g., of an RF transceiver.

Example C12 provides the electronic device according to any one of examples C5-9, where the electronic device is a computing device.

Example C13 provides the electronic device according to any one of examples C5-12, where the electronic device is included in a base station of a wireless communication system.

Example C14 provides the electronic device according to any one of examples C5-12, where the electronic device is included in a user equipment device (i.e., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a substrate;
a plurality of vertical transistors over the substrate;
a first conductive line having a first longitudinal axis and conductively coupled to gates of a first subset of the plurality of vertical transistors; and
a second conductive line having a second longitudinal axis and wrapping around at least portions of channel materials of a second subset of the plurality of vertical transistors,
wherein at least one of the first longitudinal axis and the second longitudinal axis is not parallel to any edges of the substrate.

2. The IC device according to claim 1, wherein:
the first longitudinal axis is not parallel to any of the edges of the substrate, and
the second longitudinal axis is substantially parallel to an edge of the edges of the substrate.

3. The IC device according to claim 1, wherein:
the first longitudinal axis is not parallel to any of the edges of the substrate, and
the second longitudinal axis is not parallel to any of the edges of the substrate.

4. The IC device according to claim 3, wherein:
vertical transistors of the first subset are arranged along a first line,
vertical transistors of the second subset are arranged along a second line,
the first line is not parallel to any of the edges of the substrate, and
the second line is not parallel to any of the edges of the substrate.

5. The IC device according to claim 3, wherein the first longitudinal axis is substantially perpendicular to the second longitudinal axis.

6. The IC device according to claim 1, wherein an angle between a projection of the first longitudinal axis onto a plane of the substrate and a projection of the second longitudinal axis onto the plane is between 5 and 85 degrees.

7. The IC device according to claim 6, wherein:
the first subset and the second subset have in common one vertical transistor of the plurality of vertical transistors, and
the one vertical transistor that is in common between the first subset and the second subset has six other vertical transistors of the plurality of vertical transistors to which the one vertical transistor is equidistant.

8. The IC device according to claim 7, wherein:
a first pair of the six other vertical transistors are in the first subset, and
a second pair of the of the six other vertical transistors, different from the first pair, are in the second subset.

9. The IC device according to claim 7, wherein the six other vertical transistors are in a honeycomb pattern around the one vertical transistor.

10. The IC device according to claim 1, wherein a gate insulator of an individual vertical transistor of the plurality of vertical transistors includes a hysteretic element.

11. The IC device according to claim 1, wherein an individual vertical transistor of the plurality of vertical transistors is conductively coupled a capacitor, and a capacitor insulator of the capacitor includes a hysteretic element.

12. The IC device according to claim 11, wherein the hysteretic element includes a material at least 5% of which is in an orthorhombic phase and/or a tetragonal phase, the material including one or more of:
a material including hafnium, zirconium, and oxygen,
a material including silicon, hafnium, and oxygen,
a material including germanium, hafnium, and oxygen,
a material including aluminum, hafnium, and oxygen,
a material including yttrium, hafnium, and oxygen,
a material including lanthanum, hafnium, and oxygen,
a material including gadolinium, hafnium, and oxygen, and
a material including niobium, hafnium, and oxygen.

13. The IC device according to claim 11, wherein the hysteretic element includes a stack of a material that includes silicon and oxygen and a material that includes silicon and nitrogen.

14. The IC device according to claim 1, wherein:
the IC device further includes an insulator material over the substrate,
an individual vertical transistor of the plurality of vertical transistors is in an opening in the insulator material,
a channel material of the individual vertical transistor is at a sidewall of the opening and at a bottom of the opening,
a gate electrode material of a gate of the individual vertical transistor is within the opening,
for the individual vertical transistor, the channel material is between the insulator material and the gate electrode material, and
a third conductive line is conductively coupled to a portion of the channel material of the individual vertical transistor at the bottom of the opening.

15. The IC device according to claim 14, wherein:
the individual vertical transistor is one of vertical transistors of the second subset,
the portions of the channel materials of the second subset are first portions of the channel materials of the second subset, and
the third conductive line has a third axis and is conductively coupled to second portions of the channel materials of the second subset.

16. The IC device according to claim 14, wherein:
the individual vertical transistor is one of vertical transistors of the first subset, and
the third conductive line has a third axis and is conductively coupled to portions of channel materials of the first subset.

17. An integrated circuit (IC) device, comprising:
a substrate;
an insulator material over the substrate;
a plurality of memory cells in respective openings in the insulator material, wherein, for an individual memory cell of the plurality of memory cells:
a sidewall of the opening and a bottom of the opening have layers of a stack of a channel material and a gate insulator material,
a gate electrode material is within at least a portion of the opening, and
the gate insulator material is between the channel material and the gate electrode material;
a first conductive line, conductively coupled to the gate electrode material of a first subset of the plurality of memory cells; and
a second conductive line, wrapping around at least a portion of the sidewall of the opening of a second subset of the plurality of memory cells,
wherein:
an angle between a projection of the first conductive line onto a plane parallel to the substrate and a projection of the second conductive line onto the plane is between 5 and 85 degrees.

18. The IC device according to claim 17, wherein the individual memory cell further includes a capacitor that includes a capacitor electrode that is conductively coupled to a portion of the channel material at the bottom of the opening.

19. The IC device according to claim 17, wherein the first subset and the second subset have, at most, one memory cell in common.

20. An integrated circuit (IC) device, comprising:
a substrate;
an insulator material over the substrate;
a plurality of transistors in respective openings in the insulator material, wherein, for an individual transistor of the plurality of transistors:
a semiconductor material is at a sidewall of the opening and a bottom of the opening,
a gate electrode material is at least in the opening, and
the semiconductor material is between the insulator material and the gate electrode material;
a first conductive line, conductively coupled to the gate electrode material of each transistor of a first subset of the plurality of transistors;
a second conductive line, wrapping around at least a portion of the semiconductor material at the sidewall of the opening of each transistor of a second subset of the plurality of transistors; and
a third conductive line, conductively coupled to at least a portion of the semiconductor material at the bottom of the opening of either the each transistor of the first subset of the plurality of transistors or the each transistor of the second subset of the plurality of transistors.

21. The IC device according to claim 20, wherein:
a transistor of the plurality of transistors is part of the first subset and part of the second subset.

22. The IC device according to claim 20, wherein:
at least one of the first conductive line and the second conductive line is not parallel to any borders of the substrate.

23. An integrated circuit (IC) device, comprising:
a die;
a plurality of transistors over the die;
a first conductive line over the die, the first conductive line extending along a first longitudinal axis and coupled to gates of a first subset of the plurality of transistors; and
a second conductive line over the die, the second conductive line extending along a second longitudinal axis and wrapping around at least portions of channel materials of a second subset of the plurality of transistors,
wherein at least one of the first longitudinal axis and the second longitudinal axis is angled with respect to an edge of the die.

24. The IC device according to claim 23, wherein:
the first longitudinal axis is not parallel to any of the edges of the die, and
the second longitudinal axis is substantially parallel to an edge of the edges of the die.

25. The IC device according to claim 23, wherein:
the first longitudinal axis is not parallel to any of the edges of the die, and
the second longitudinal axis is not parallel to any of the edges of the die.

26. The IC device according to claim 25, wherein:
vertical transistors of the first subset are arranged along a first line,
vertical transistors of the second subset are arranged along a second line,
the first line is not parallel to any of the edges of the die, and
the second line is not parallel to any of the edges of the die.

27. The IC device according to claim 25, wherein the first longitudinal axis is substantially perpendicular to the second longitudinal axis.

28. The IC device according to claim 23, wherein an angle between a projection of the first longitudinal axis onto a plane of the die and a projection of the second longitudinal axis onto the plane is between 5 and 85 degrees.

* * * * *

UNITED STATES PATENT AND TRADEMARK OFFICE
CERTIFICATE OF CORRECTION

| | | |
|---|---|---|
| PATENT NO. | : 12,471,289 B2 | Page 1 of 1 |
| APPLICATION NO. | : 17/558688 | |
| DATED | : November 11, 2025 | |
| INVENTOR(S) | : Sharma | |

It is certified that error appears in the above-identified patent and that said Letters Patent is hereby corrected as shown below:

On the Title Page

On Page 2, item (56), under "Other Publications", in Column 2, Line 10, delete "Oxidde,"" and insert -- Oxide," --, therefor.

In the Claims

In Column 43, Claim 8, Line 16, delete "of the of the" and insert -- of the --, therefor.

In Column 43, Claim 11, Line 27, delete "coupled" and insert -- coupled to --, therefor.

Signed and Sealed this
Thirtieth Day of December, 2025

John A. Squires
*Director of the United States Patent and Trademark Office*